(12) United States Patent
Li et al.

(10) Patent No.: US 10,115,625 B2
(45) Date of Patent: Oct. 30, 2018

(54) METHODS FOR REMOVAL OF HARD MASK

(71) Applicant: GLOBALFOUNDRIES Singapore Pte. Ltd., Singapore (SG)

(72) Inventors: Liang Li, Singapore (SG); Yun Ling Tan, Singapore (SG); Hai Cong, Singapore (SG); Changwei Pei, Singapore (SG); Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 50 days.

(21) Appl. No.: 15/394,851

(22) Filed: Dec. 30, 2016

(65) Prior Publication Data

US 2018/0190537 A1  Jul. 5, 2018

(51) Int. Cl.
| | | |
|---|---|---|
| *H01L 21/762* | (2006.01) | |
| *H01L 21/306* | (2006.01) | |
| *H01L 21/308* | (2006.01) | |
| *H01L 21/3065* | (2006.01) | |
| *H01L 27/11548* | (2017.01) | |
| *H01L 27/11575* | (2017.01) | |

(52) U.S. Cl.
CPC .... *H01L 21/76224* (2013.01); *H01L 21/3065* (2013.01); *H01L 21/3085* (2013.01); *H01L 21/30604* (2013.01); *H01L 21/30625* (2013.01); *H01L 27/11548* (2013.01); *H01L 27/11575* (2013.01)

(58) Field of Classification Search
None
See application file for complete search history.

(56) References Cited

U.S. PATENT DOCUMENTS

| | | | | |
|---|---|---|---|---|
| 2003/0067050 | A1* | 4/2003 | Kim | H01L 21/76224 257/501 |
| 2005/0224864 | A1* | 10/2005 | Hashimoto | H01L 21/28202 257/315 |
| 2006/0202273 | A1* | 9/2006 | Yajima | H01L 21/823462 257/355 |
| 2007/0128804 | A1* | 6/2007 | Jin | H01L 27/115 438/258 |
| 2012/0034783 | A1* | 2/2012 | Entalai | H01L 21/76232 438/694 |

(Continued)

*Primary Examiner* — Angel Roman
(74) *Attorney, Agent, or Firm* — Horizon IP Pte Ltd.

(57) ABSTRACT

Embodiments of a method of processing semiconductor devices are presented. The method includes providing a substrate prepared with isolation regions having a non-planar surface topology. The substrate includes at least first and second regions. The first region includes a memory region and the second region includes a logic region. A hard mask layer is formed covering the substrate and the isolation regions with non-planar surface topology. The method includes selectively processing an exposed portion of the hard mask layer over a select region while protecting a portion of the hard mask layer over a non-select region. The top substrate area and isolation regions of the non-select region are not exposed during processing of the portion of the hard mask layer over the select region. Hard mask residue is completely removed over the select region during processing of the exposed portion of the hard mask layer.

25 Claims, 24 Drawing Sheets

(56) References Cited

U.S. PATENT DOCUMENTS

| | | |
|---|---|---|
| 2012/0070952 A1 | 3/2012 | Hsu et al. |
| 2012/0088368 A1 | 4/2012 | Hsu et al. |
| 2013/0122699 A1 | 5/2013 | Wang |
| 2015/0024588 A1 | 1/2015 | Chen et al. |

* cited by examiner

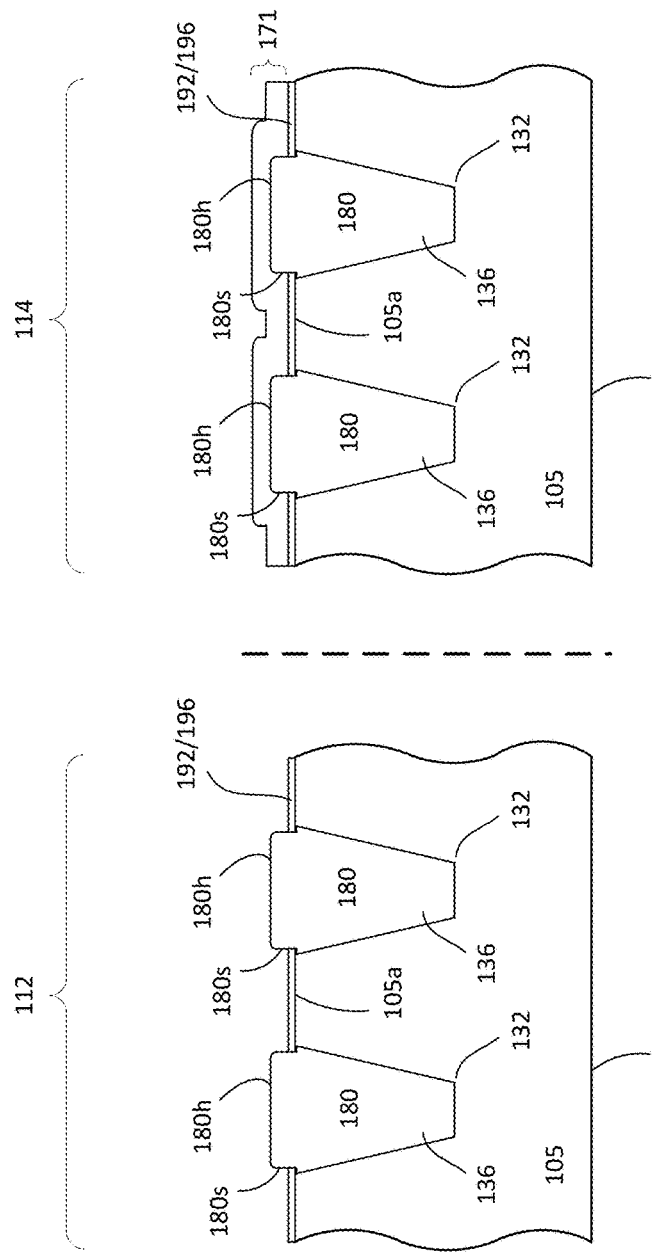

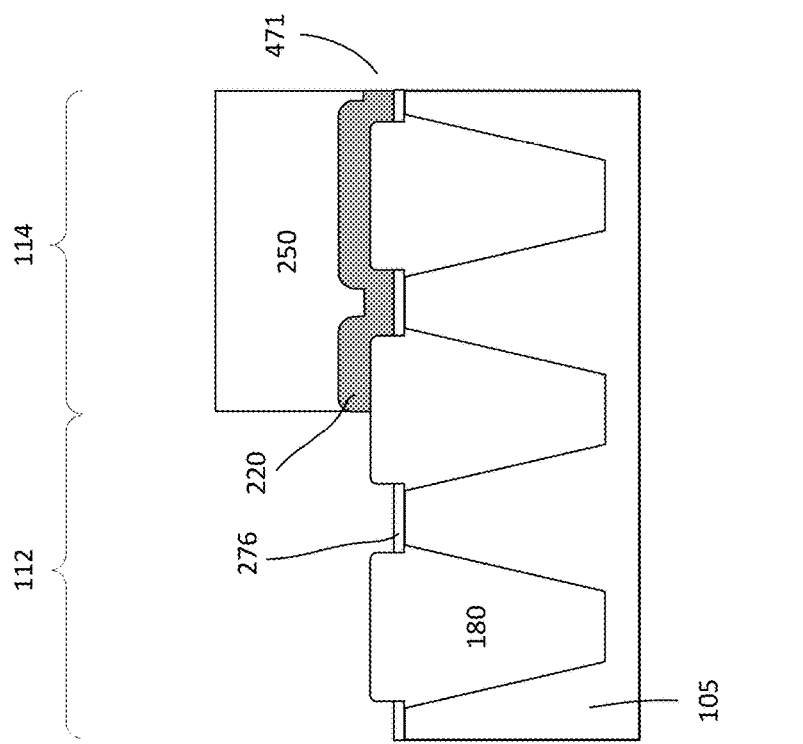

METHODS FOR REMOVAL OF HARD MASK

BACKGROUND

In some integrated circuit fabrication process, one or more hard masks may be used in processing operations to form various device features. Hard mask is usually used during patterning processes to pattern an underlying layer to form or define device features. In some process schemes, one or more patterned hard masks may also be temporarily employed to selectively expose one or more semiconductor regions for processing, while protecting the other semiconductor regions from being processed. Depending on the designed process, the hard masks may be removed after the processing operation is completed.

Ideally, the method to remove the hard mask results in complete removal of the hard mask layer(s) without leaving any residual hard mask material on the underlying layer and with minimum impact on the underlying layer. This can become challenging when the hard mask layer is conformally formed on a layer with non-planar or non-uniform surface topography. Moreover, conventional hard mask removal schemes for a semiconductor layer with topography are difficult to control and unreliable.

Accordingly, there remains a need for reliable hard mask removal methods that completely remove hard mask layers.

SUMMARY

Embodiments generally relate to methods for forming semiconductor devices. For example, embodiments relate to the process of removing hard mask layers over shallow trench isolation (STI) regions. In one embodiment, a method of forming a device is described. The method includes providing a substrate prepared with isolation regions having a non-planar surface topology. The substrate includes at least first and second regions. The first region includes a memory region and the second region includes a logic region. A hard mask layer is formed covering the substrate and the isolation regions with non-planar surface topology. The method includes selectively processing an exposed portion of the hard mask layer over a select region while protecting a portion of the hard mask layer over a non-select region. The select region is one of the first and second device regions. The top substrate area and isolation regions of the non-select region are not exposed during processing of the portion of the hard mask layer over the select region. Hard mask residue is completely removed over the select region during processing of the exposed portion of the hard mask layer.

In another embodiment, a method of forming a device is described. The method includes providing a layer having a non-planar surface topology over a substrate. The layer comprises at least first and second regions. A hard mask layer is formed covering the layer with non-planar surface topology. The method includes selectively processing an exposed portion of the hard mask layer over a select region while protecting a portion of the hard mask layer over a non-select region. The select region is one of the first and second regions. The top surface of the non-select region of the layer is not exposed during processing of portion of the hard mask layer over the select region. Hard mask residue is completely removed over the select region during processing of the exposed portion of the hard mask layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a-1d show cross-sectional views of an embodiment of a process for forming a device;

FIGS. 4a-4d show cross-sectional views of another embodiment of a process for forming a device;

DETAILED DESCRIPTION

Figure 1A:
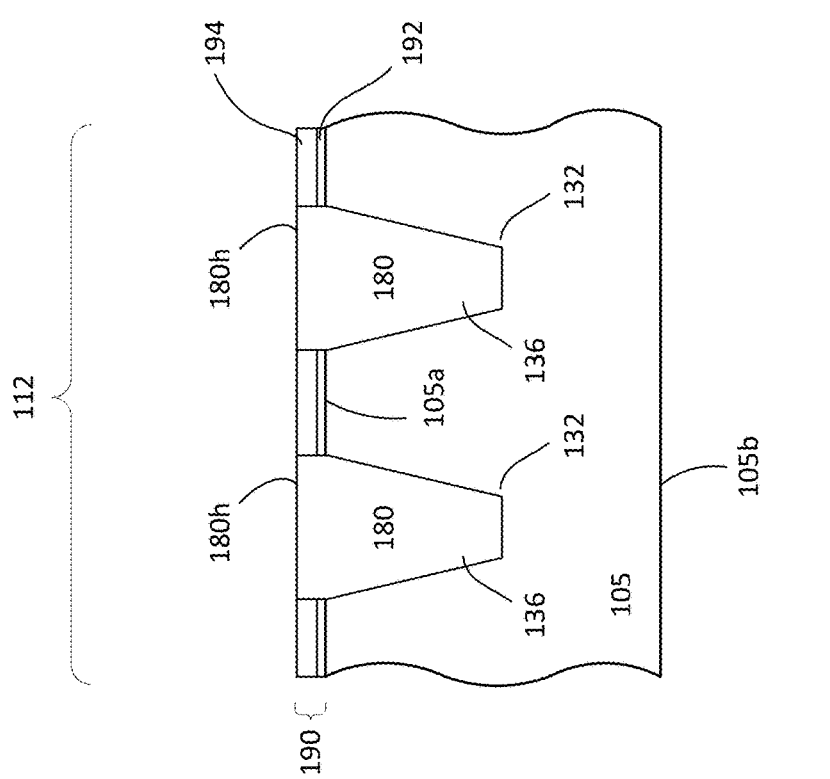

Embodiments generally relate to methods of processing semiconductor devices or integrated circuits (ICs). The methods as will be presented in this disclosure are generally directed to methods which effectively and completely remove one or more hard mask layers with non-planar surface topography without leaving any residual hard mask material on underlying layer of which the hard mask layer is disposed thereon. The methods also result in minimal impact or no impact on the underlying layer(s). Such methods may be suitable for use in the processing of memory devices and logic devices which are formed and disposed on the same substrate. The devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

FIGS. 1a-1d show cross-sectional views of a process 100 for forming a device. As shown, a substrate 105 having top and bottom surfaces 105a-105b is provided. The top surface 105a may be referred to as the first major surface while the bottom surface 105b may be referred to as the second major surface. The substrate, for example, may be silicon substrate. The substrate can be lightly doped with p-type or n-type dopants. Other types of semiconductor substrates may also be used. For example, the substrate may be silicon germanium or silicon-on-insulator (SOI) as well as intrinsic or doped with other types of dopants or dopant concentrations. Illustratively, the substrate 105 as shown includes a first device region 112 for a first device.

In one embodiment, the first device region 112 is an array region for accommodating memory devices. For example, the array region may accommodate a plurality of non-volatile memory (NVM) devices. Other suitable types of memory devices, such as volatile memory devices may also be useful. Providing the substrate with other device regions may also be useful. For example, the substrate may include a second device region for a second type of device. It is understood that the substrate may include different device regions for different types of devices. For example, the substrate includes other suitable numbers of device regions.

As shown in FIG. 1a, the substrate is prepared with isolation regions 180. The isolation regions, for example, are shallow trench isolation (STI) regions. The STI regions 180 may be positioned apart from each other at intervals to define the various device regions of the substrate. The STI regions, for example, serve to isolate a device region from other device regions. Various processes can be employed to form the STI regions. For example, the substrate can be etched using etch and mask techniques to form trenches 132 which are then filled with a dielectric material 136, such as silicon oxide. Other suitable techniques for forming the STI regions may also be used.

In one embodiment, a patterned hard mask 190 is disposed on the substrate. The hard mask may be a hard mask stack which includes a pad oxide layer 192 and a pad nitride layer 194 positioned over the pad oxide layer. For example, the pad oxide layer includes a thickness of about 50 Å and the pad nitride layer includes a thickness of about 1300 Å. Other thicknesses and configurations of hard mask stack may also be useful, depending on design requirements. The pad oxide layer may be formed on the substrate top surface 105a by thermal oxidation while the pad nitride layer may be formed on the pad oxide layer by chemical vapor deposition (CVD). The pad nitride layer or upper layer of the hard mask stack serves as an etch mask while the pad oxide layer or lower layer of the hard mask stack promotes adhesion of the upper hard mask layer to the substrate. Other suitable types of hard masks or mask forming techniques may also be useful. For example, other materials which can be removed selectively to the dielectric material 136 filling the trenches 132 are also useful.

The patterned hard mask 190 is used to etch the substrate to form the trenches 132. For example, the substrate exposed by openings in the hard mask stack are removed by a reactive ion etch (ME). Patterning the hard mask may be achieved by using a lithography system. For example, a photoresist (not shown) is patterned by exposing it with an exposure source using a reticle with the desired pattern. After exposure, the photoresist is developed, transferring the pattern of the reticle to the photoresist. The patterned photoresist is then used as an etch mask to pattern the hard mask 190.

Thereafter, a dielectric material may be deposited over the substrate and fill the trenches. A planarizing process is used to remove excess dielectric material. For example, a chemical mechanical polishing (CMP) can be performed to remove excess dielectric material and provide a planar substrate top surface. In one embodiment, the CMP which removes excess dielectric material 136 of the STI regions 180 uses the pad nitride layer 194 as a polish stop. For example, the top surface 180h of the STI regions form a substantially coplanar top surface with the hard mask 190. As shown, a STI region may include a portion protruding over the substrate top surface 105a and a portion buried within the substrate.

Figure 1B:
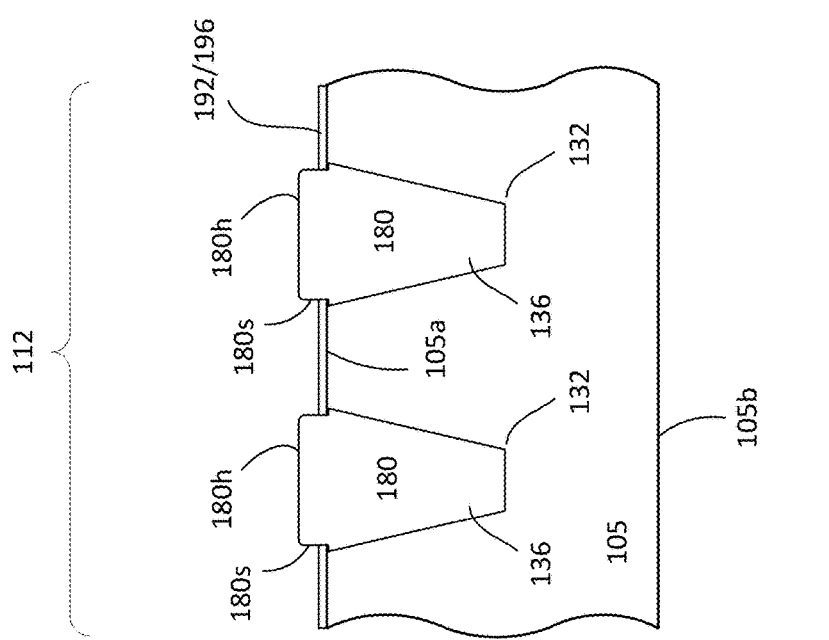

The process continues by performing a removal process on the hard mask. As shown in FIG. 1b, the pad nitride layer 194 is removed, leaving the pad oxide layer 192 remaining on the substrate top surface. Removal of the pad nitride layer may be achieved by, for example, a wet etch selective to the pad oxide layer and dielectric material 136 of the STI regions. Other suitable techniques for removing the pad nitride layer 194 may also be useful. Removing the pad nitride layer exposes a top portion of the STI region 180. For example, the exposed top portion of the STI region protrudes over the pad oxide layer 192. The height differential between the top surface 180h of the STI region and the adjacent top surfaces creates a step height over the substrate surface. This provides a non-planar surface topography as shown in FIG. 1b. In one embodiment, the step height of the STI region extends from the top surface of the pad oxide layer 192 to the top surface 180h of the STI region. The step height of the STI region is, for example, about 50 nm or less. Other configurations of STI regions may also be useful, depending on design requirements. For example, forming STI regions with a coplanar top surface (e.g., 0 nm step height) with the top surface of the pad oxide layer 192 may also be useful. The protruding portion of the STI region 180 includes side surfaces 180s exposed above the pad oxide layer 192.

Although STI regions with vertical side surfaces exposed over the substrate top surface 105a is illustrated, it is to be understood that the protruding portion of the STI regions may also include other profiles. For example, the protruding portion of the STI regions may also include a tapered profile. Other configurations of STI regions may also be useful, depending on the design and process conditions.

In one embodiment, a stripping process may be performed to remove the remaining pad oxide layer to expose the top surface of the substrate 105a and an oxide growth process may be performed subsequently to form a sacrificial layer 196 for well implants. The well implants, for example, include an implantation process to selectively form doped regions (not shown) in the device regions of the substrate. The pad oxide layer, for example, may be removed by a wet etch process, such as hydrofluoric acid (HF). Other suitable techniques may be employed to remove the pad oxide layer. In another embodiment, the remaining pad oxide layer 192 may not be removed and may serve as the sacrificial layer.

FIG. 1c illustrates a second device region 114 of substrate 105. The second device region may be provided for a second device. As shown, the first and second device regions 112 and 114 are at the same process stage. For example, isolation regions 180 are provided to define the second device region 114. In one embodiment, the second device region 114 may be a non-memory device region. For example, the second device region 114 is a logic region for accommodating logic devices. Different device regions of the substrate 105 may be processed in sequence based on different design requirements. To protect the non-selected device regions from fabrication processes to define the features or components of the selected device region, one or more hard mask layers 171 may be provided. The one or more hard mask layers may be conformally formed on the substrate 105 having the non-planar surface topography as described and shown in FIG. 1b. As a result, the one or more hard mask layers 171 as-deposited tracks the topography of the underlying layer(s) and thus includes the non-planar surface topography. The one or more hard mask layers may be processed to selectively expose portions of the selected device region for processing while protecting the non-selected device regions. Various techniques for processing of the one or more hard mask layers 171 which are conformally formed over the non-planar surface topography of the substrate 105 will be described in detail with reference to FIGS. 2a-2e, FIGS. 4a-4d and FIGS. 7a-7d later.

Figure 1D:
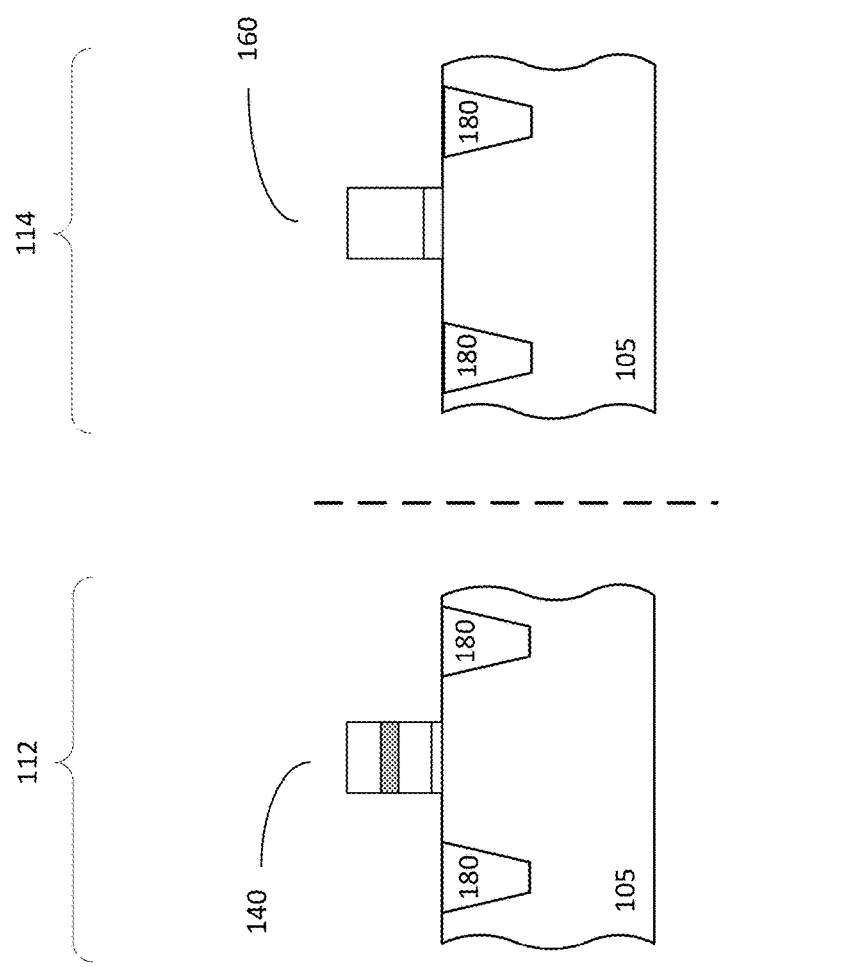

As shown in FIG. 1d, the process 100 may continue to form one or more components or device features on the same substrate 105. As an example, the substrate may be provided with a memory region 112 and a logic region 114. A memory region may include a NVM device and a logic region may include a logic device. For example, the memory region 112 includes a memory gate 140 of a storage transistor and the logic region 114 includes a logic gate 160 of a logic transistor. A transistor gate includes a gate electrode over a gate dielectric. As an example, the components of the different device regions may be sequentially formed using the patterned hard mask 171 to satisfy different design requirements, such as different gate dielectric thickness.

Processing of the different device regions to define the features or components of the devices may reduce the step height of the STI regions. For example, the device regions may be processed to result in STI regions having a top surface which is coplanar with the substrate top surface having a memory gate and a logic gate defined thereon as shown in FIG. 1d. The process 100 may include additional processing for forming device contact regions, such as source/drain regions, and contact pads to the contact regions. Conventional back-end-of-line (BEOL) processes may be performed to finish the manufacturing of the device. Further, interconnect metal levels may be provided to form interconnections to the device contact regions and other circuit components, as desired. Other processes may include, for example, final passivation, dicing and packaging. It is also understood that the process steps as described above may be modified accordingly to produce a desired device.

FIGS. 2a-2e show cross-sectional views of an embodiment of a process 200 for forming a device. The device is, for example, an integrated circuit (IC). Other types of devices may also be useful. The process 200 may include common features as described in FIGS. 1a-1d. In the interest of brevity, common elements and features having the same reference numerals may not be described or described in detail.

Figure 2A:
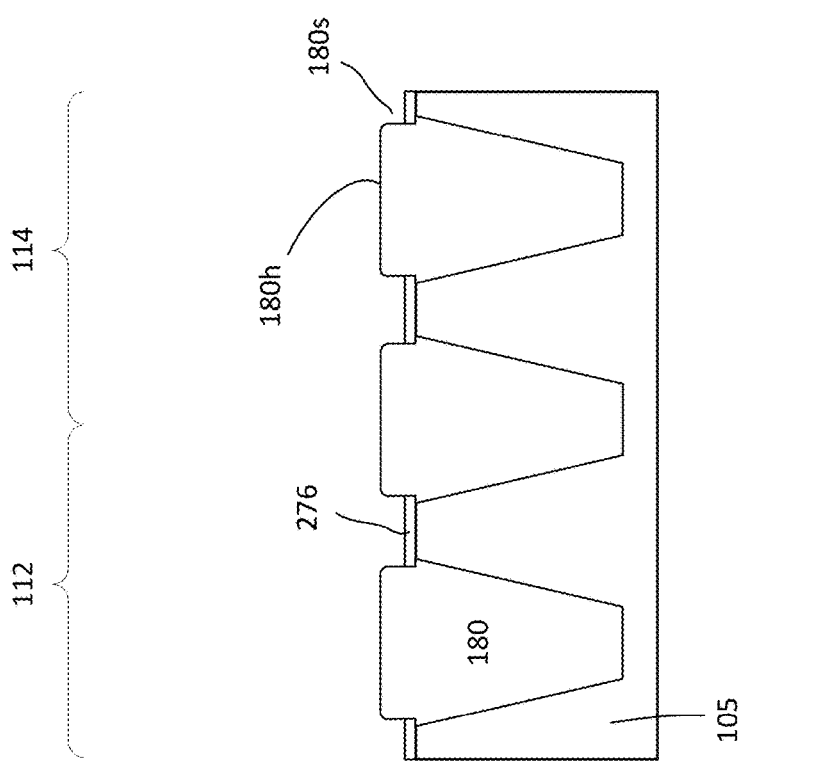
FIGS. 2a-2e show cross-sectional views of an embodiment of a process for forming a device.

Referring to FIG. 2a, a substrate 105 is provided. The substrate can include a silicon substrate, such as a lightly doped p-type or n-type substrate. Other types of substrates, including silicon germanium, germanium, gallium arsenide, or SOI, are also useful. Providing a substrate with other types of dopants or dopant concentrations as well as an undoped substrate, may also be useful.

The substrate 105 is prepared with first and second device regions 112 and 114 and isolation regions 180. The isolation regions, for example, serve to isolate a device region from other device regions. The isolation regions, for example, are STI regions. In one embodiment, the first device region 112 may accommodate memory devices. For example, the first device region may be an array region for accommodating NVM devices. Other types of memory devices may also be useful. As for the second device region 114, it may accommodate logic devices. For example, the second device region is a logic region. It is understood that the substrate may include other device regions (not shown) which are suitable for accommodating other types of devices.

Various processes can be employed to form the STI regions 180 in the substrate. As described in FIGS. 1a-1d, a mask and etch technique may be employed to form the STI regions. After forming the STI regions, the etch mask may be removed and a pad oxide or sacrificial layer 276 may be formed or remained on the substrate top surface. The sacrificial layer is, in one embodiment, a thin silicon oxide layer. For example, the silicon oxide layer includes a thickness of about 50-250 Å. Other suitable materials and thicknesses may also be used to form the sacrificial layer 276. The sacrificial layer may serve as an implant screen for subsequent implant steps to form doped regions in the substrate.

In one embodiment, the STI regions include portions protruding over the top surface of the substrate. For example, the STI regions include top portions which are exposed and protruded above the sacrificial layer 276. In one embodiment, the STI regions include a step height extending from the top surface of the sacrificial layer 276 to the top surface 180h of the STI region. The step height of the STI region is, for example, about 50 nm or less. In one embodiment, the step height is about 30 nm. Other step heights may also be useful. The exposed top portions of the STI region 180 includes side surfaces 180s exposed above the sacrificial layer 276.

As shown, the profile of the STI regions 180 creates a non-planar surface topography above the substrate 105. For example, the elevated top surface 180h of the STI regions create a step height topography, with the top surface of the sacrificial layer 276 forming recessed regions between the exposed top portions of the STI regions protruding above the sacrificial layer.

Figure 2B:
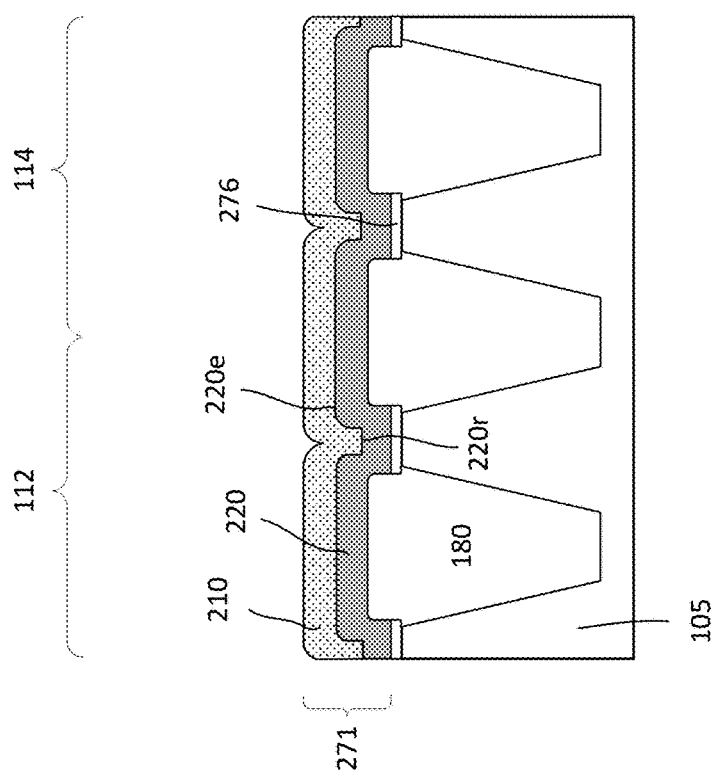

Referring to FIG. 2b, a hard mask 271 is formed over the substrate 105. For example, a hard mask is conformally formed on the STI regions 180 and the sacrificial layer 276. Thus, the hard mask also includes a non-planar surface topography as shown in FIG. 2b. The hard mask 271 may be a hard mask stack which includes multiple dielectric layers. In one embodiment, the hard mask stack 271 includes first and second dielectric layers 220 and 210 having materials with high etch selectivity with each other. For example, the first dielectric layer 220 includes silicon nitride ($Si_3N_4$) and the second dielectric layer 210 includes silicon oxide ($SiO_2$). Other configurations of hard mask may also be useful. The first and second dielectric layers may be formed by any suitable deposition processes to form the hard mask 271.

The first dielectric layer 220, for example, may be formed by chemical vapor deposition (CVD). Other techniques for forming the first dielectric layer may also be useful. The first dielectric layer lines the exposed top portion of the STI regions and the top surface of the sacrificial layer 276. The first dielectric layer, for example, may include a thickness of about 10-80 nm. Other suitable thicknesses may also be useful. The second dielectric layer 210, for example, may be formed by CVD. Other processes, such as a furnace process, may also be useful for forming the second dielectric layer. The second dielectric layer lines the top surface of the first dielectric layer 220. The second dielectric layer, for example, includes a thickness about 10-80 nm. Other suitable thicknesses may also be useful.

As shown, the step height topography of the STI regions results in a first dielectric layer having a non-planar surface topography with elevated and recessed surface regions 220e and 220r. For example, the elevated surface regions 220e correspond to the top of the STI regions 180h and the recessed surface regions 220r correspond to the recessed regions between the STI regions.

Figure 2C:
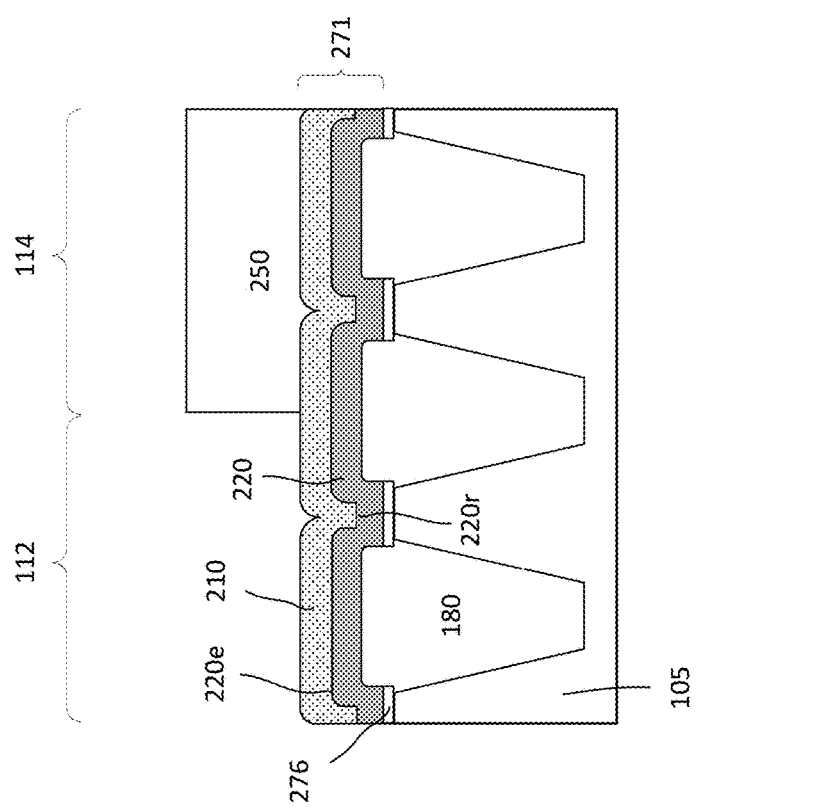

Referring to FIG. 2c, a resist or soft mask layer 250 is formed on the hard mask stack 271. The soft mask layer 250, for example, includes a photoresist. The resist layer 250, in one embodiment, includes materials suitable for low wavelength exposure source. Other suitable types of material may also be useful. In one embodiment, the soft mask layer 250 is patterned to form openings. The openings, for example, expose one or more device regions of the substrate 105 which are selected for processing. The soft mask layer, for example, is patterned to expose a select device region while covering a non-select device region. In one embodiment, the select device region is the memory region 112 while the logic region 114 is the non-select region which is covered by the soft mask. For example, the patterned soft mask exposes the memory region while protecting the logic region. Other configurations of the soft mask may also be useful.

In one embodiment, a photolithography process is employed to pattern the resist layer or soft mask layer 250. An exposure source may be used as the radiation source to expose the resist through a reticle with the desired pattern. The resist layer is then developed, transferring the pattern of the reticle to the resist layer 250. The patterned resist 250, in one embodiment, include openings to expose portions of the hard mask 271 disposed over the memory region. The patterned resist is, for example, used as an etch mask to pattern one or more layers of the hard mask stack.

Figure 2D:
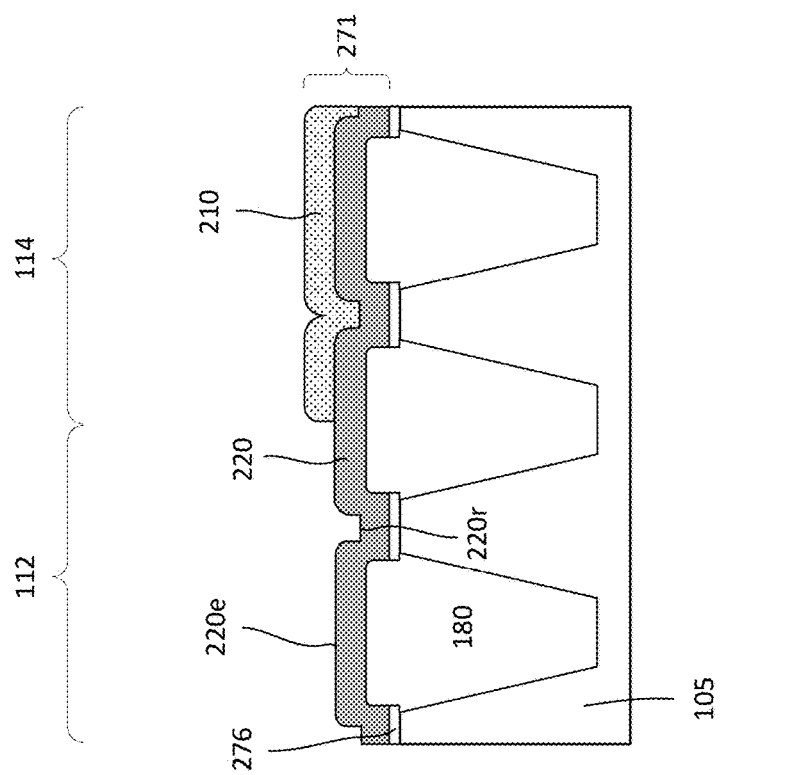

Referring to FIG. 2*d*, an etch process is performed to pattern a portion of the second dielectric layer 210 of the hard mask 271. For example, a first etch process is performed. The first etch process, for example, selectively removes a portion of the second dielectric layer 210 unprotected by the resist layer 250. The first etch process may be a first wet etch process. The wet etch, in one embodiment, includes an etch chemistry which is highly selective to the second dielectric layer 210 of the hard mask stack such that the first dielectric layer 220 is not damaged or recessed. The first wet etch process, in one embodiment, may be performed using diluted hydrofluoric acid (DHF) to provide the desired etch selectivity. For example, the wet etch employs a $H_2O$-to-HF dilution ratio of about 1:100, and is performed at a temperature of about 25° C. Under such conditions, SiO-to-SiN etch selectivity of more than about 5:1 can be obtained. Other suitable process parameters or techniques for selectively removing the second dielectric layer may also be used.

The first wet etch removes the second dielectric layer 210 exposed by the resist layer completely. The example, the first etch removes the second dielectric layer unprotected by the resist layer to expose the underlying first dielectric layer 220. The first dielectric layer 220, for example, serves as an etch stop layer. As shown, the patterned resist 250 protects the logic region 114 and exposes the memory region 112 to the first etch process The resist layer 250 may be removed after the first etch process is finished. For example, a second etch process is performed to remove the resist layer 250. The second etch process, for example, selectively removes the resist layer over the logic region 114. The second etch process may be a second wet etch process. The wet etch, in one embodiment, includes an etch chemistry which is highly selectively to the resist layer 250. For example, the etch chemistry removes the resist layer while leaving the exposed portion of the first dielectric layer 220 intact.

The second wet etch process, in one embodiment, may be performed using a sulfuric acid/hydrogen peroxide mixture (SPM) to provide the desired etch selectivity. For example, the wet etch employs sulfuric acid ($H_2SO_4$) and hydrogen peroxide ($H_2O_2$) mixed in a $H_2SO_4$-to-$H_2O_2$ concentration ratio of about 6:1, and is performed at a temperature of about 120° C. and for a duration of about 300 s. Other etch chemistries or techniques for removing the resist layer are also useful. In one embodiment, a cleaning process is performed after the second wet etch process. The cleaning process, for example, removes organic contaminants and/or etching residues after the second etch process. For example, a Standard Clean 1 (SC-1) process is employed. Other suitable cleaning processes may also be useful.

In one embodiment, the first wet etch, the second wet etch and the cleaning process may be an integrated etch process. For example, the various etches may be integrated into the same wet bench process. For example, DHF, SPM and SC-1 may be performed in the same wet bench process. Afterwards a drying process may be performed. This is because drying is not performed with the resist. Performing the etches as a non-integrated etch process may also be useful. For example, the first wet etch, the second wet etch and the cleaning process may be performed separately. Other configurations of the etches may also be useful.

Figure 2E:
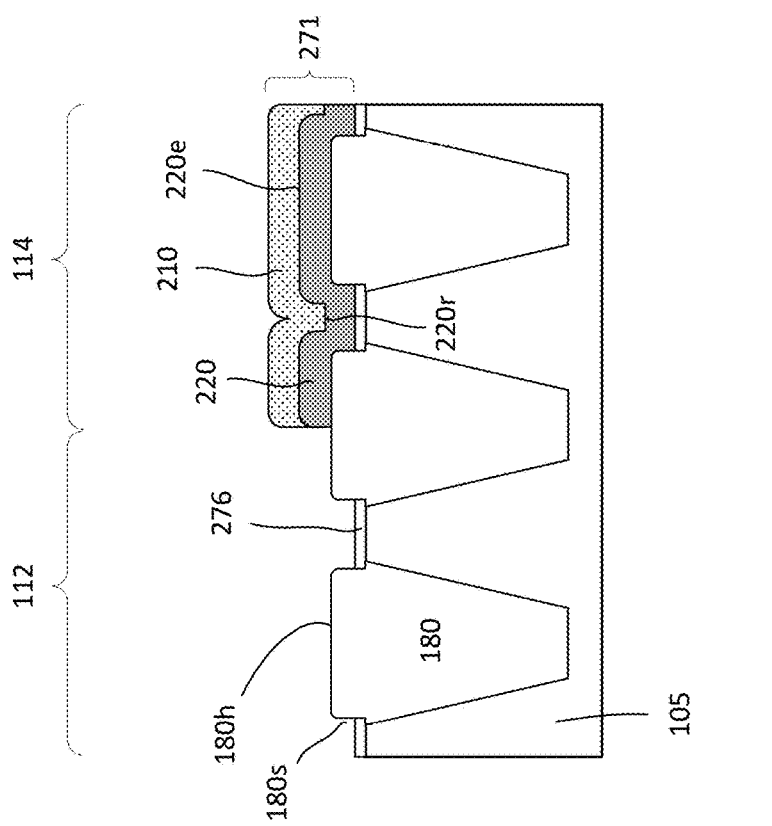

Referring to FIG. 2*e*, a third etch process is performed to pattern a portion of the first dielectric layer 220 of the hard mask 271. The third etch process, for example, selectively removes exposed portion of the first dielectric layer 220 unprotected by the second dielectric layer 210. The third etch process may be a third wet etch process. The wet etch, in one embodiment, includes an etch chemistry which is highly selective to the first dielectric layer 220 of the hard mask stack such that the underlying dielectric structures, including the STI regions 180 and the sacrificial layer 276, are not damaged or recessed. For example, the third wet etch process is configured to include a SiN-to-SiO etch selectivity of more than about 20:1. The third wet etch process, in one embodiment, may be performed using hot phosphoric acid ($H_3PO_4$) to provide the desired etch selectivity. For example, the wet etch employs a heated $H_3PO_4$, and is performed at a temperature of about 150-170° C. for a duration of about 500 s. Other suitable process parameters or techniques for selectively removing the first dielectric layer are also useful. The wet etch continues until the first dielectric layer 220 is completely removed to expose the top surface of the sacrificial layer 276. The sacrificial layer 276, for example, serves as an etch stop layer to protect the substrate 105. As shown, the third etch process leaves the second dielectric layer 210 remaining to protect the logic region 114 while the first dielectric layer is completely removed to expose the memory region 112.

The process may continue to define the device regions in sequence as described in FIG. 1*d*. For example, the remaining patterned hard mask 271 protects the logic region from oxidation and thermal budget while the memory region 112 is processed to form memory components or devices, including memory gate. The logic region 114 may be processed after processing the memory region 112. Additional processes may be performed to complete the device.

Figure 3A:
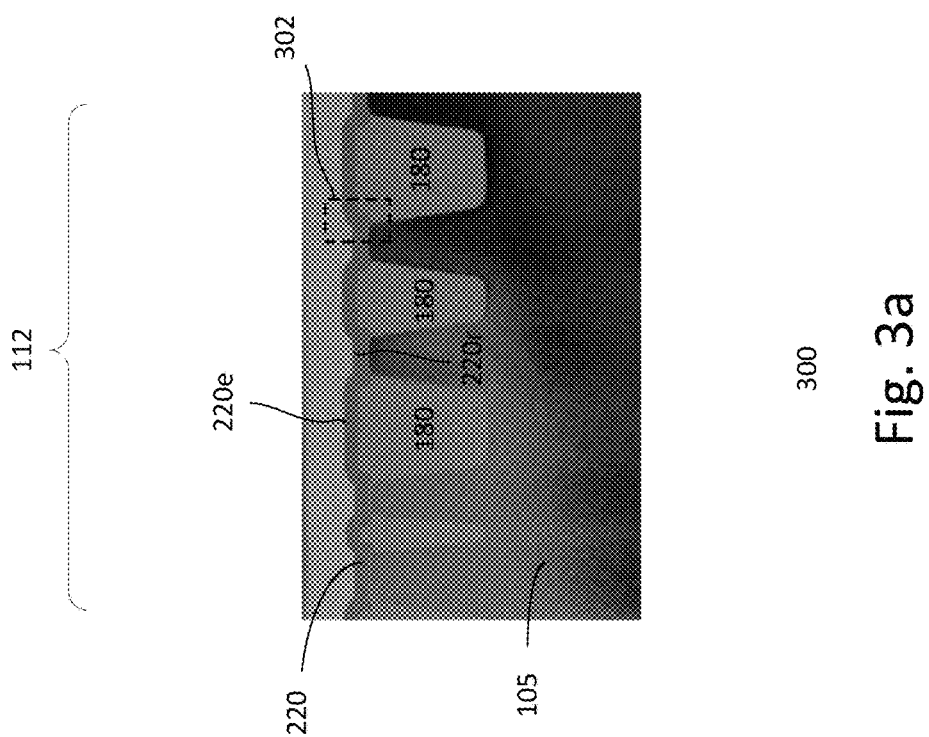
FIGS. 3a-3b show TEM images of an embodiment of a portion of a device in the present disclosure.
Figure 3B:
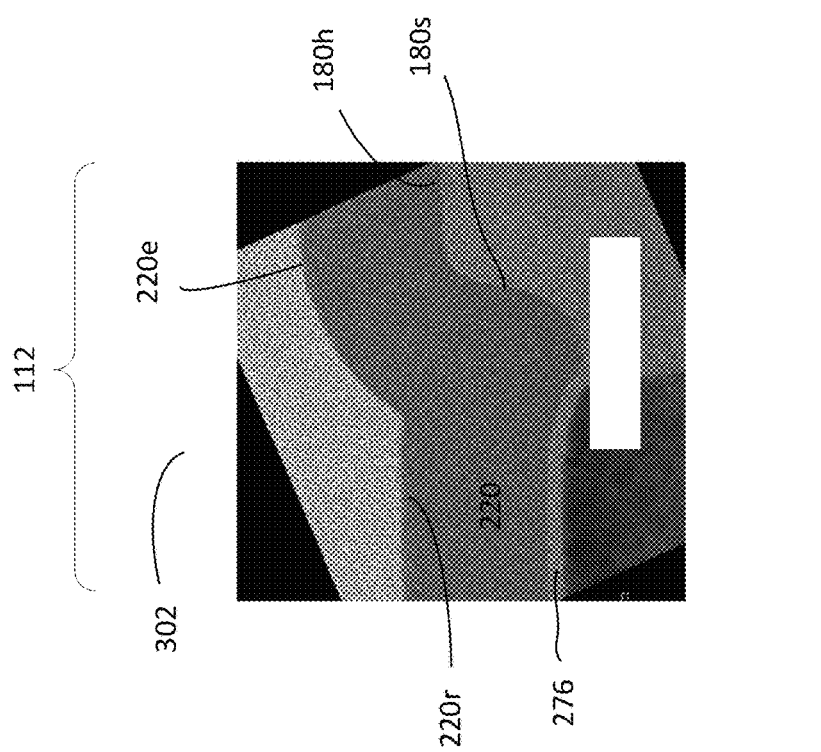

FIGS. 3*a*-3*b* show transmission electron microscope (TEM) images of a portion of a device 300. The device is, for example, an IC. Other types of devices may also be useful. The device 300 may include common features as described in FIGS. 2*a*-2*e*. In the interest of brevity, common elements and features having the same reference numerals may not be described or described in detail.

Referring to FIG. 3*a*, a partially processed substrate 105 is provided. The substrate, for example, includes device regions and various configurations of isolation regions 180 isolating the device regions. For example, various widths of STI regions in the device are shown in FIG. 3*a*. The partially processed substrate may be at the same stage as that described in FIG. 2*d*. For example, a hard mask disposed over the memory region 112 of the substrate is partially processed. The hard mask may be a hard mask stack having a second hard mask layer 210 disposed over a first hard mask layer 220. For example, the second hard mask layer may be silicon oxide and the first hard mask layer may be silicon nitride. In accordance with an embodiment of the present disclosure, the second hard mask layer is patterned to expose a portion of the first hard mask layer over the memory region 112. The first hard mask layer 220, as shown, conformally lines the protruding portions of the STI regions 180 and the sacrificial layer 276 to create a non-planar surface topography having elevated and recessed surface regions 220e and 220r.

Referring to FIG. 3b, an enlarged view 302 of a portion of the memory region 112 is provided. As described in FIG. 2d, a first wet etch process is employed to remove the second hard mask layer and expose the first hard mask layer. The first hard mask layer, for example, serves as an etch stop layer. As shown, the first etch process includes sufficient process margin to completely remove the second hard mask layer while minimizing consumption of the underlying first hard mask layer 220. This advantageously results in eliminating any residual oxide material on the recessed surface regions 220r while maintaining the integrity of the silicon nitride layer 220. In addition, the absence of hard mask residues further improves the reliability of the device.

FIGS. 4a-4d show cross-sectional views of another embodiment of a process 400 for forming a device. The device is, for example, an IC. Other types of devices may also be useful. The process 400 may include common features as described in the processes shown in FIGS. 1a-1d and FIGS. 2a-2e. In the interest of brevity, common elements and features having the same reference numerals may not be described or described in detail.

Figure 4A:
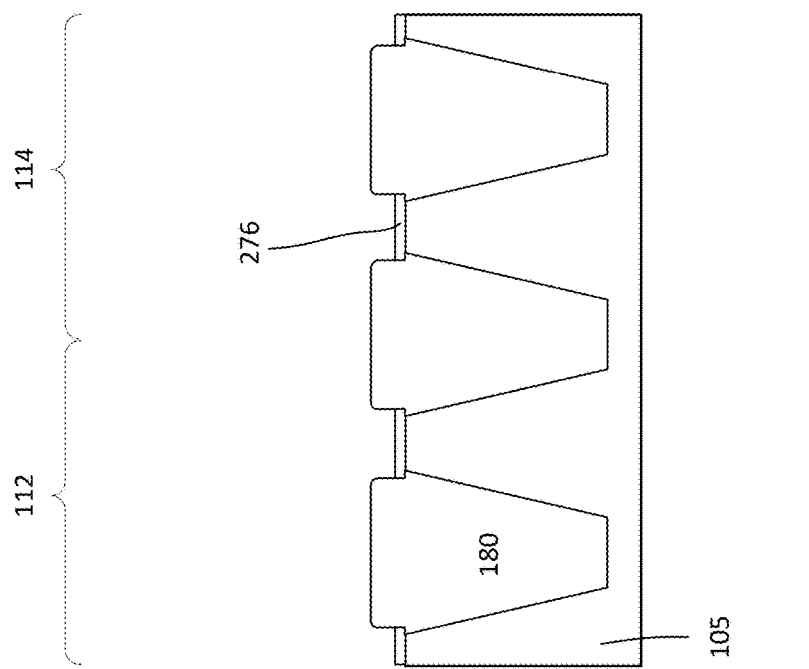

Referring to FIG. 4a, a partially processed substrate is provided. The partially processed substrate is at the same stage as that described in FIG. 2a. For example, the substrate 105 is prepared with first and second device regions 112 and 114 and isolation regions 180. The materials and features of the partially processed substrate are the same as that described in FIG. 2a. As such, common elements may not be described or described in detail.

Figure 4B:
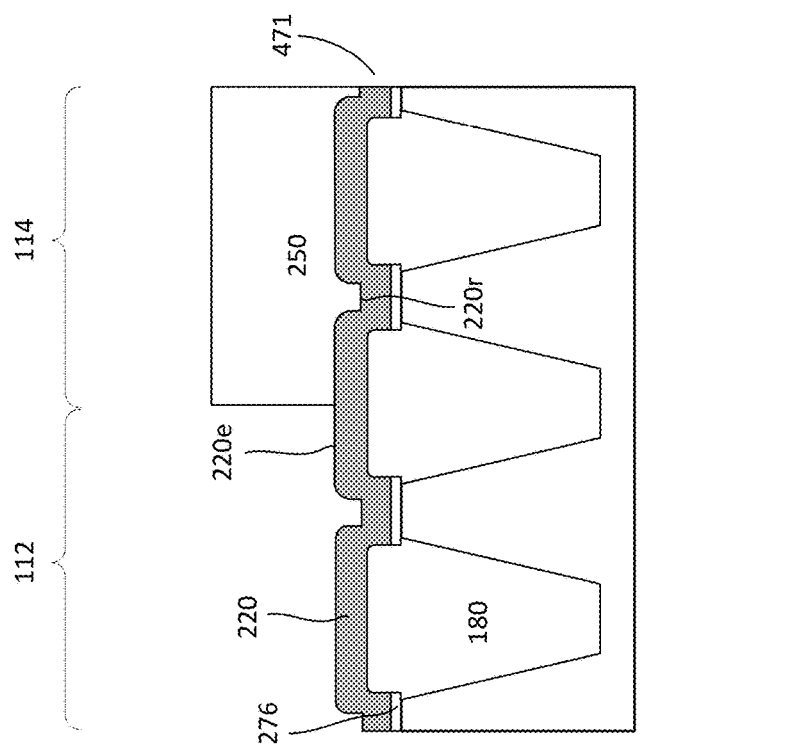

The process continues to form a hard mask 471 over the substrate 105, as shown in FIG. 4b. For example, a hard mask is conformally formed on the STI regions 180 and the sacrificial layer 276. The hard mask 471, in one embodiment, includes a dielectric layer 220. In one embodiment, the dielectric layer 220 includes a material with high etch selectivity to the material of the STI regions 180 and sacrificial layer 276. For example, the hard mask includes a first dielectric material while the STI regions and sacrificial layer include a second dielectric material. The material of the hard mask may be silicon nitride ($Si_3N_4$) and the material of the STI regions may be silicon oxide ($SiO_2$). The hard mask may be formed by any suitable deposition processes. In one embodiment, the hard mask 471 is formed by CVD using silicon nitride to line the exposed top portion of the STI regions and the top surface of the sacrificial layer 276. Other techniques, such as a furnace process, may also be employed to form the hard mask 471. The dielectric layer 220, for example, includes a thickness of about 10-80 nm. As shown, the hard mask 471 includes a non-planar surface topography with elevated and recessed surface regions 220e and 220r.

A resist or soft mask layer 250 is formed on the hard mask 471. The soft mask layer 250 is, for example, patterned to expose a portion of the hard mask 471. The patterned resist layer is then used as an etch mask to pattern the hard mask. The process to form the patterned resist 250 includes materials and techniques similar to that described in FIG. 2c. As such, details for forming the resist 250 will not be described. The patterned resist layer protects the logic region 114 while exposing the memory region 112.

Referring to FIG. 4c, a first etch process is performed to pattern the hard mask 471. The first etch process, for example, selectively removes a portion of the hard mask 471 unprotected by the patterned resist 250. The first etch process may be an anisotropic dry etch. The dry etch, in one embodiment, includes an etch chemistry which is highly selective to the hard mask such that the underlying dielectric structures, including the STI regions 180 and the sacrificial layer 276, are not damaged or recessed. The dry etch process, in one embodiment, may be performed using reactive ion etch (RIE) to provide the desired etch selectivity. For example, the RIE employs a $CH_2F_2/Ar/O_2$ or $CHF_3/Ar/O_2$ chemistry, and is performed at a temperature of about 20-80° C. and a pressure of about 2-100 mTorr. Under such conditions, SiN-to-SiO etch selectivity of more than about 20:1 can be obtained. Other process parameters or techniques for selectively removing the hard mask are also useful. The dry etch removes the hard mask 471 exposed by the patterned resist. For example, the dry etch removes the exposed portion of the hard mask to expose the top surface of the sacrificial layer 276. The sacrificial layer 276, for example, serves as an etch stop layer to protect the substrate 105.

Figure 4D:
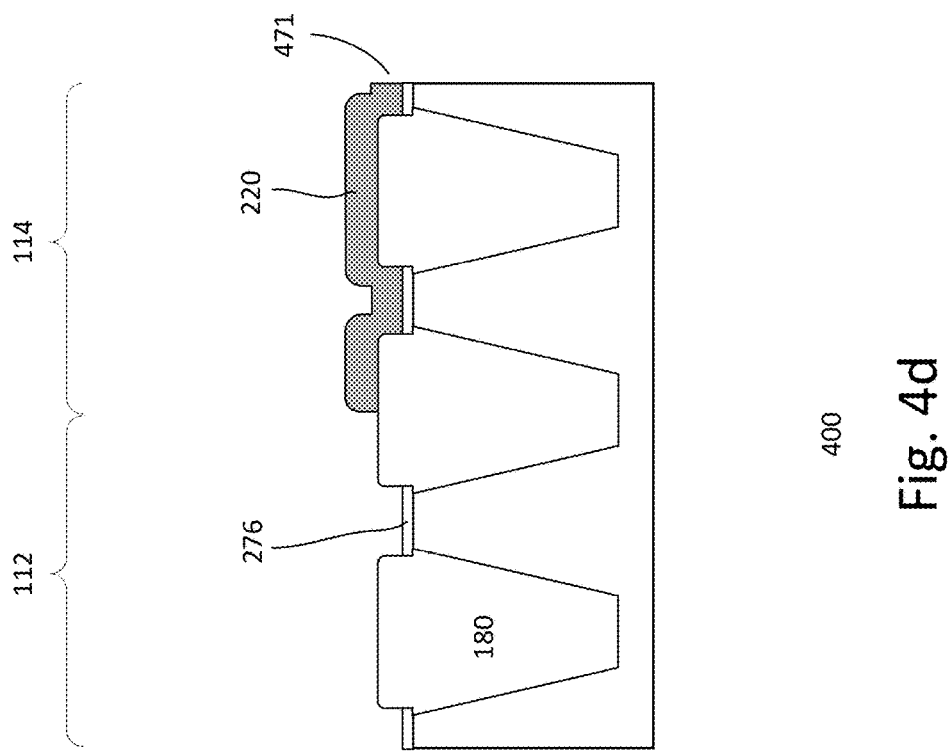

Referring to FIG. 4d, the process continues to remove the patterned resist 250. In one embodiment, a second etch process is performed to remove the resist layer 250. The second etch process, for example, selectively removes the resist layer over the logic region 114. Various techniques may be employed to remove the resist layer. In one embodiment, the second etch process may be a wet etch, such as a chemical resist strip (CRS). The CRS process employs a wet etch chemistry. For example, a wet etch process employing sulfuric acid/hydrogen peroxide mixture (SPM) may be used to remove the resist layer 250. For example, the wet etch process may contain the same process steps as that described in FIG. 2d. As such, details for performing the second etch process will not be described. Other etch chemistries or techniques for removing the resist layer are also useful. A cleaning process, such as SC-1, may be performed after the CRS.

In some embodiments, removal of the patterned resist layer may be achieved using a combination of a physical resist strip (PRS) and a CRS. The PRS process may include a dry etch or ashing process. For example, $O_2$ plasma ashing may be employed at a temperature of about 200° C. or higher. The CRS may be performed after the PRS, followed by a SC-1 clean. Other techniques for removing the resist layer may also be useful.

After removing the resist 250, the process may continue to process the device regions in sequence as described in FIG. 1d. For example, the remaining patterned hard mask 471 protects the logic region from oxidation and thermal budget while the memory region 112 is processed to form memory components or devices, including memory gate. The logic region 114 may be processed to form logic components, including logic gate, after processing the memory region 112. Additional processes may be performed to complete the device.

Figure 5A:
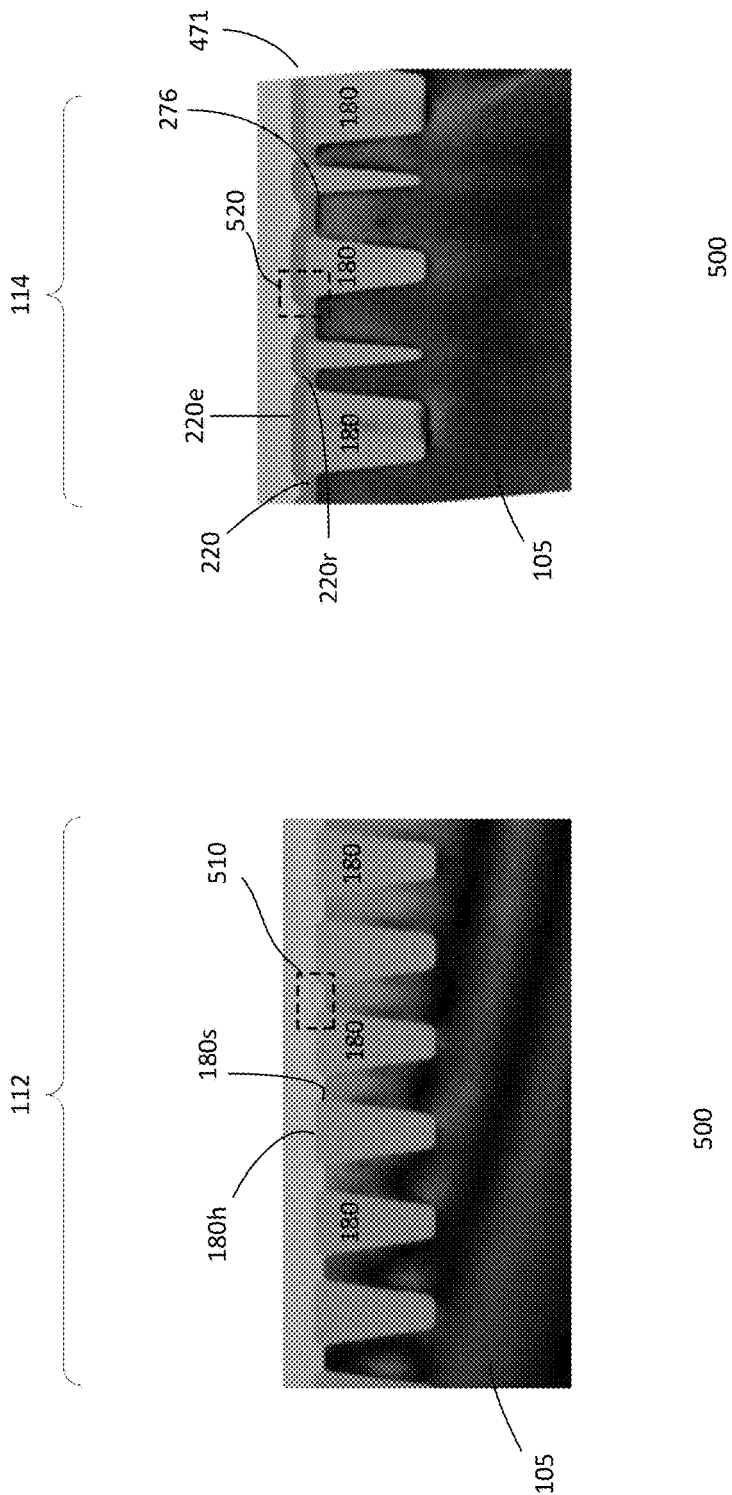
FIGS. 5a-5b show TEM images of another embodiment of a portion of a device in the present disclosure.
Figure 5B:
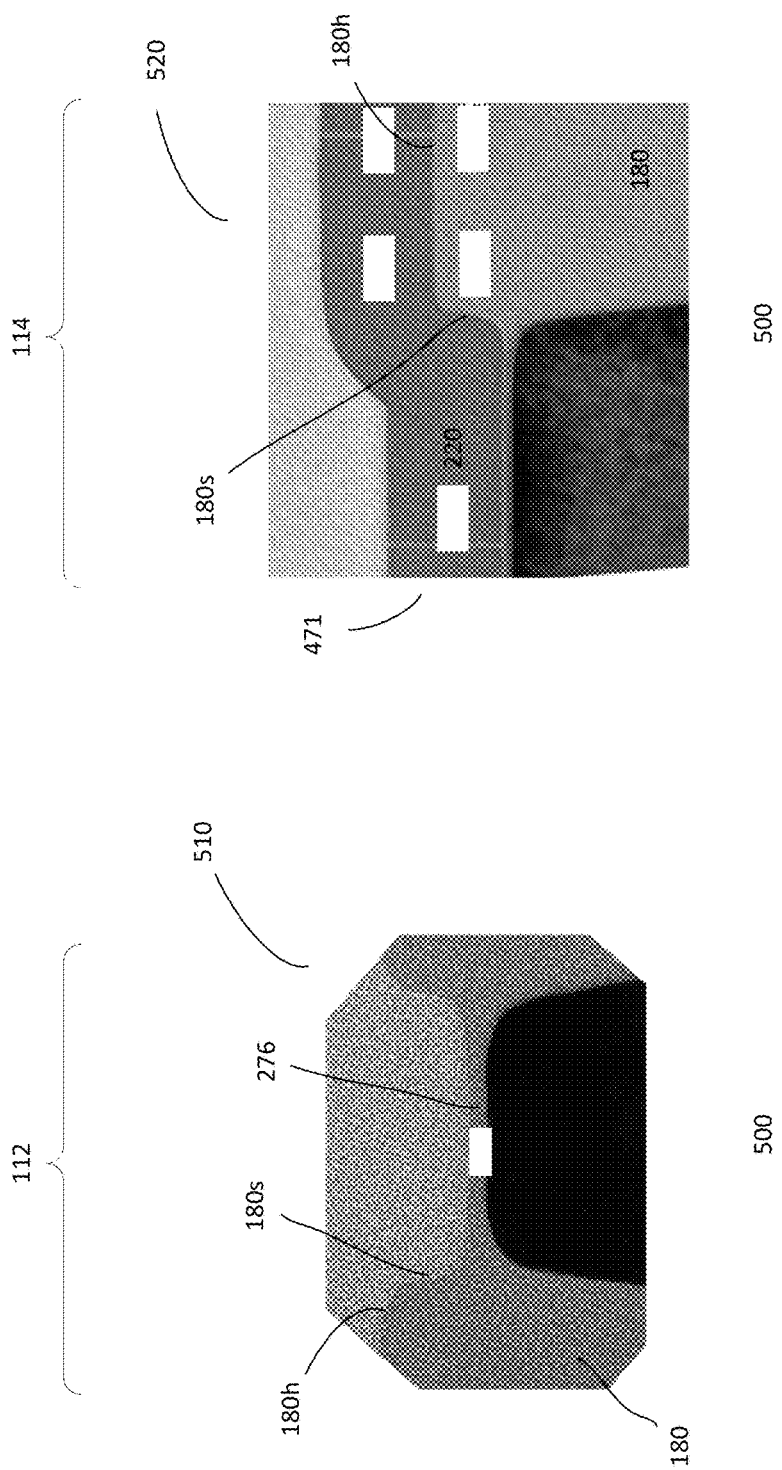

FIGS. 5a-5b show transmission electron microscope (TEM) images of a portion of a device 500. In one embodiment, the device includes a memory region 112 and a non-memory region, such as a logic region 114. The device is, for example, an IC. Other types of devices may also be useful. The device 500 includes common features as shown and as described in FIGS. 4a-4d. In the interest of brevity, common elements and features having the same reference numerals may not be described or described in detail.

Referring to FIG. 5a, a partially processed substrate 105 is provided. The substrate, for example, includes various device regions 112 and 114 and isolation regions 180. The partially processed substrate may be at the same stage as that described FIG. 4d. In accordance with an embodiment of the present disclosure, the hard mask 471 is patterned to expose the memory region 112. As for the logic region 114, it is covered and protected by the patterned hard mask 471. The hard mask 471 disposed over the logic region, as shown, conformally lines the protruding portions of the STI regions 180 and the sacrificial layer 276 and includes a non-planar surface topography having elevated and recessed surface regions 220e and 220r.

In one embodiment, the profile of the STI regions creates a step height topography, with the top surface of the sacrificial layer 276 forming recessed regions between the elevated top surface 180h of the STI regions. For example, the STI regions 180 include protruding portions having side surfaces 180s exposed above the sacrificial layer 276.

Referring to FIG. 5b, magnified views 510 and 520 of portions of the memory region 112 and logic region 114 are provided. As described in FIG. 4c, a first etch process is employed to pattern the hard mask 471. The sacrificial layer 276, for example, serves as an etch stop layer. As shown, the first etch process employs an anisotropic etch which is highly selective to the material of the hard mask layer to provide sufficient process margin to completely remove the exposed portion of the hard mask layer while minimizing consumption of the underlying sacrificial layer 276 and the step height of the STI regions 180 in the memory region 112. This advantageously results in eliminating any residual hard mask material in the recessed regions of the step height topography while maintaining the profile of the STI regions. Further, the patterned hard mask 471 in accordance with the embodiment described in FIG. 4d protects the logic region 114 from attack by the etchants used to process the memory region 112.

Figure 6:
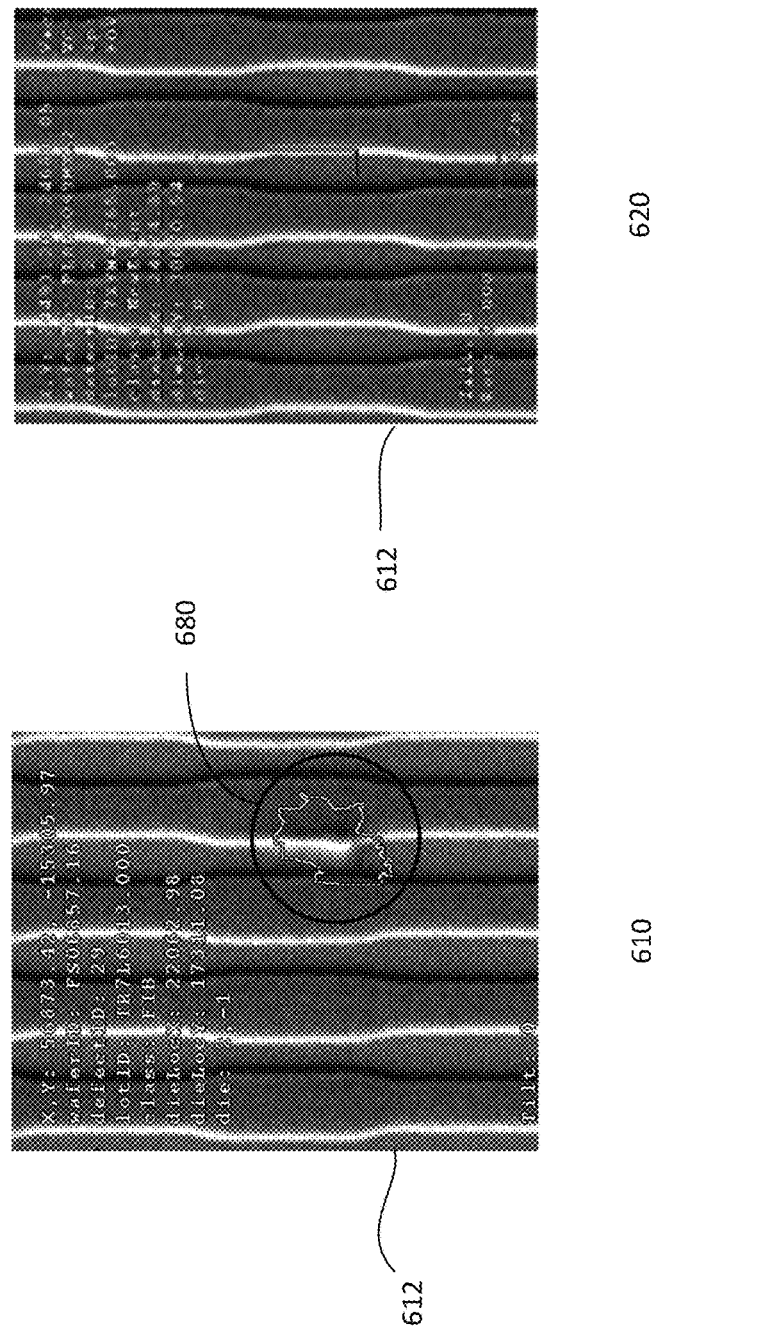
FIG. 6 shows SEM images comparing a first substrate processed by conventional means to a second substrate processed by embodiments of the present disclosure.

FIG. 6 shows scanning electron microscope (SEM) images of a first substrate 610 and a second substrate 620. The substrates 610 and 620 may be silicon substrates of different semiconductor wafers. Each wafer or substrate includes an active device region 612 on which a plurality of devices may be formed. Other types of substrates or wafers may also be used. In one embodiment, the first and second substrates 610 and 620 are partially processed to include a patterned hard mask having one or more hard mask layers disposed on a non-planar substrate surface similar to that shown in FIG. 1c. For example, the portion of the hard mask (not shown) above the active device region 612 of the substrates 610 and 620 are removed. The images as shown, illustrate experimental results comparing conventional hard mask removal processes performed on the first substrate 610 to the new hard mask removal process 400 performed on the second substrate 620. For example, the partially processed substrate 620 may be at the same stage as that described in FIG. 4d.

The SEM technique is deployed to detect any residual hard mask material on the surface of the partially processed substrates 610 and 620. As shown, no surface particle or hard mask residue was observed on the second substrate 620 following the hard mask removal process 400 as described with reference to FIGS. 4a-4d, while residual hard mask material 680 was observed on the first substrate 610 following hard mask removal using conventional processes. It is appreciated that complete removal of hard mask material advantageously prevents yield loss caused by hard mask residues remaining around STI structures.

FIGS. 7a-7d show cross-sectional views of another embodiment of a process 700 for forming a device. The device is, for example, an IC. Other types of devices may also be useful. The process 700 includes common features as described and shown in FIGS. 1a-1d, FIGS. 2a-2e, and FIGS. 4a-4d. In the interest of brevity, common elements and features having the same reference numerals may not be described or described in detail.

Figure 7A:
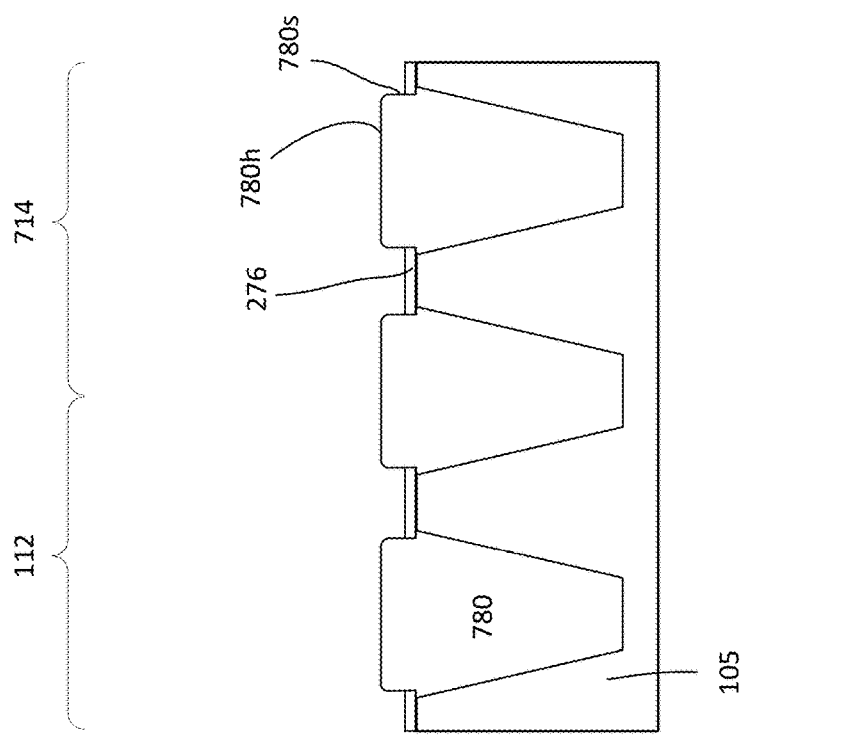
FIGS. 7a-7d show cross-sectional views of another embodiment of a process for forming a device.

Referring to FIG. 7a, a partially processed substrate 105 is provided. The partially processed substrate is at the same stage as that described in FIG. 2a and FIG. 4a. For example, the substrate 105 is prepared with first and second device regions 112 and 114 and isolation regions 780. An isolation region is, for example, a STI region. Other type of isolation regions may also be useful. The process to form the STI regions 780 may include materials and techniques similar to that described for forming the STI regions 180 as shown in FIGS. 1a-1b, except that the STI regions 780 are formed with a protruding portion that extends higher above the sacrificial layer 276 than the STI regions 180 as shown in FIG. 2a-2e and FIGS. 4a-4d.

Various processes can be employed to form the STI regions 780. As described, the substrate 105 can be etched using etch and mask techniques to form trenches which are then filled with a dielectric material, such as silicon oxide. For example, a patterned hard mask (not shown) is disposed on the substrate to form trenches. An adhesion layer or sacrificial layer 276 may separate the patterned hard mask (not shown) from the substrate top surface. The hard mask may be silicon nitride and the adhesion layer may be silicon oxide. Other suitable types of hard masks or mask forming techniques may also be useful. In one embodiment, the hard mask to form the STI regions includes a thick silicon nitride layer. For example, the silicon nitride layer includes a thickness of about 1600 Å. A thicker hard mask layer may result in STI regions having a higher step height. Other hard mask thickness may also be useful, depending on design requirements.

After formation of the STI regions, the silicon nitride layer (not shown) may be removed using suitable techniques. This results in STI regions 780 having portions protruding over the top surface of the substrate as shown in FIG. 7a. For example, the STI regions include top portions which are exposed and protruded above the sacrificial layer 276. In one embodiment, the STI regions include a step height extending from the top surface of the sacrificial layer 276 to the top surface 780h of the STI region. The step height of the STI region is, for example, about 30-50 nm. Other configurations of step height may also be useful. The exposed top portion of the STI region 780 includes side surfaces 780s exposed and extends above the sacrificial layer 276. As shown, the profile of the STI regions 780 creates a non-planar surface topography above the substrate 105.

Figure 7B:
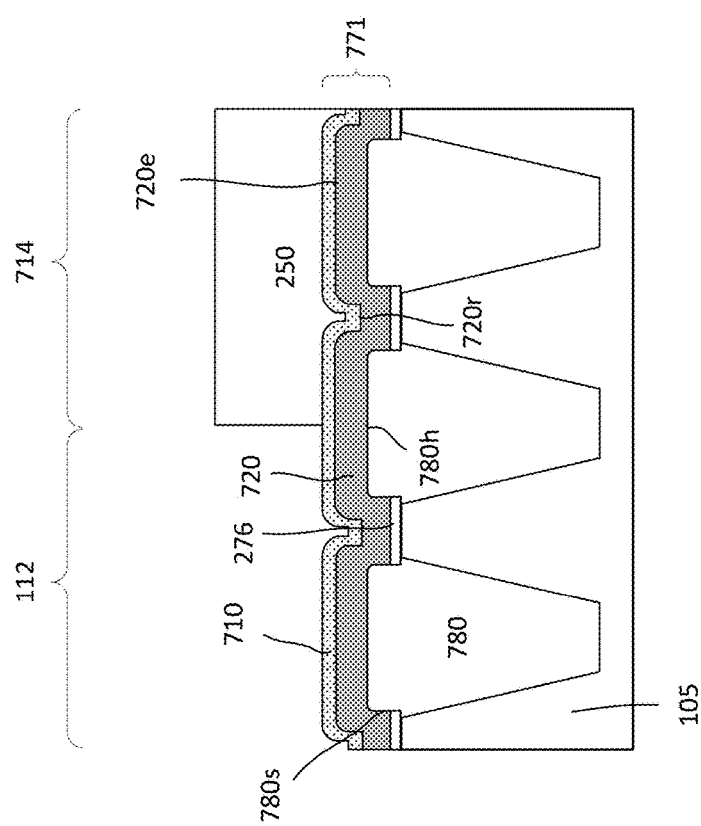

Referring to FIG. 7b, a hard mask 771 is disposed over the substrate 105. For example, a hard mask is conformally formed on the STI regions 780 and the sacrificial layer 276. The hard mask 771, in one embodiment, includes a hard mask stack having multiple dielectric layers. In one embodiment, the hard mask stack 771 includes first and second dielectric layers 720 and 710 having materials with high etch selectivity with each other. For example, the first dielectric layer 720 includes silicon nitride ($Si_3N_4$) and the second dielectric layer 710 includes silicon oxide ($SiO_2$). Other configurations of hard mask may also be useful. As shown, the hard mask as-deposited includes the non-planar surface topography.

The first dielectric layer may be formed by any suitable deposition process. In one embodiment, the first dielectric layer 720 is formed by CVD using silicon nitride to line the exposed top portion of the STI regions 780 and the top surface of the sacrificial layer 276. Other techniques, such as a furnace process, may also be employed to form the first dielectric layer. The first dielectric layer, for example, includes a thickness of about 10-80 nm. Other suitable thicknesses may also be useful.

The second dielectric layer 710 may be provided by any suitable oxidation process for forming a sufficiently thin oxide layer on the first dielectric layer (i.e. nitride layer). The second dielectric layer may be silicon oxide. The second dielectric layer, for example, includes a thickness about 10-50 Å. Other suitable thicknesses may also be useful. In one embodiment, the second dielectric layer 710 is provided by a plasma surface treatment of the first dielectric layer 720. The plasma surface treatment, for example, employs a plasma-assisted oxidation process to oxidize a surface portion of the first dielectric layer 720 to form an oxide layer having the desired thickness. For example, the plasma power (High Frequency Radio Frequency (HFRF)/Low Frequency Radio Frequency (LFRF), gas flow and duration can be selected to form the second dielectric layer 710 within a surface portion of the first dielectric layer 720. The plasma surface oxidation may include any suitable types of oxygen containing plasma. In an exemplary process, the plasma oxidation process is performed with ozone ($O_3$) containing plasma at a pressure of about 1700 mTorr, gas flow of about 15000-20000 sccm $O_3$, and power of about 2000-3000 W for about 20-50 s. Other suitable process parameters and techniques to form the second dielectric layer may also be useful.

In another embodiment, the second dielectric layer 710 may be formed by a wet oxidation process, such as in-situ steam generation (ISSG). ISSG oxidation of a silicon nitride surface may employ a mixture of multiple gas chemistries in combination with suitable flow rates, temperature and pressure to form a thin oxide layer having the desired thickness. In an exemplary process, the ISSG employs a mixture of oxygen ($O_2$) and hydrogen ($H_2$), and is performed using oxidation pressure of about 4000-8000 mTorr, while the oxidation temperature is about 1000-1100° C. Other suitable process parameters may also be useful. Other types of wet oxidation process may also be useful.

In yet another embodiment, the second dielectric layer 710 may be formed by a furnace wet oxidation process. A wet oxidation process may employ a wet ambient in combination with suitable oxidation time, temperature and pressure to form a thin oxide layer having the desired thickness on top of the first dielectric layer. In an exemplary process, the wet oxidation process employs a mixture of oxygen ($O_2$) and hydrogen ($H_2$), and is performed at a temperature of about 900-950° C., a pressure of about 0.8-1.2 atm, and for a duration of about 3-4 hours. Other suitable process parameters may also be useful.

The process continues to form a resist or soft mask layer 250 on the hard mask 771. The soft mask layer 250 is, for example, patterned to expose a portion of the hard mask 771. The patterned resist layer is then used as an etch mask to pattern the exposed hard mask stack. The process to form the patterned resist 250 includes materials and techniques similar to that described in FIG. 2c. As such, details for forming the resist 250 will not be described.

Figure 7C:
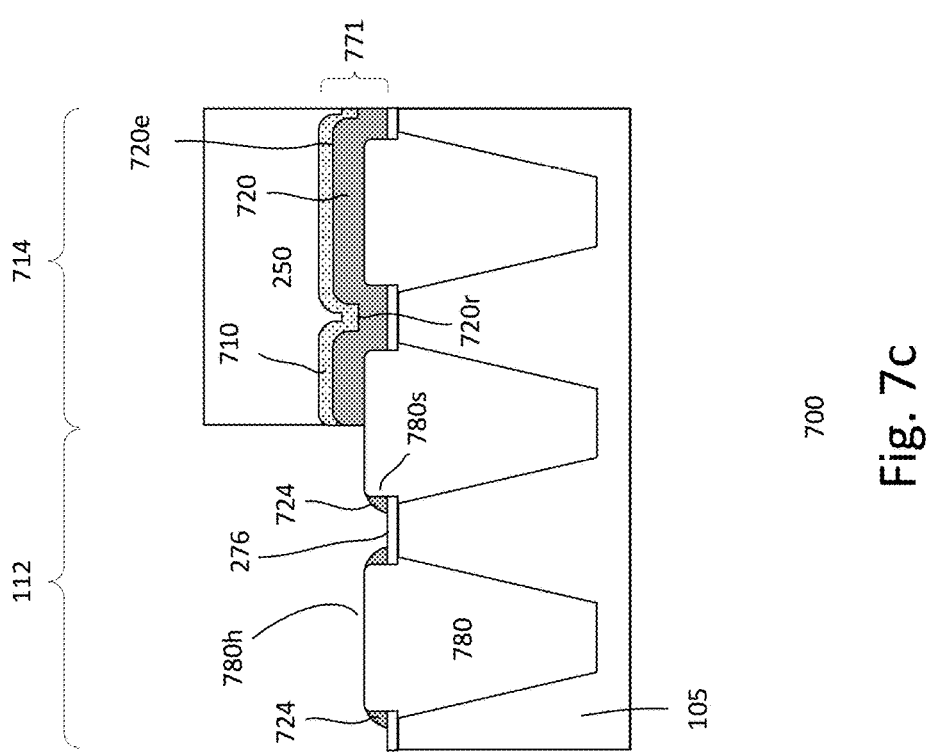

Referring to FIG. 7c, a first etch process is performed. The first etch process, in one embodiment, removes both the second and the first dielectric layers 710 and 720. The first etch process, for example, selectively removes exposed portion of the hard mask 771 disposed in device regions which are unprotected by the resist layer 250. The first etch process may be an anisotropic dry etch, such as a reactive ion etch (RIE). The dry etch, in one embodiment, includes an etch chemistry which is highly selective to the hard mask such that the underlying dielectric structures, including the STI regions 780 and the sacrificial layer 276, are not damaged or recessed. As the second dielectric layer of the hard mask stack is sufficiently thin, the anisotropic dry etch etches both the first and second dielectric layers of the hard mask stack. As shown, the sacrificial layer 276 in the memory region, for example, serves as an etch stop layer to protect the underlying substrate 105.

In another embodiment, the first etch process may employ different etch chemistries to remove the second and first dielectric layers. For example, tetrafluoromethane ($CF_4$), fluoroform ($CHF_3$), octafluorocyclobutane ($C_4F_8$), hexafluoro-2-butyne ($C_4F_6$) may be used to remove the second dielectric (silicon oxide) layer 710 while a different chemistry, such as those employed in a RIE process, may be used for removing the first dielectric (silicon nitride) layer 720. The first etch process completely removes the hard mask to expose the sacrificial layer 276. For example, the first dielectric (silicon nitride) layer is completely removed to expose the sacrificial layer. The sacrificial layer 276, for example, serves as an etch stop layer to protect the substrate 105. The patterned resist 250, as shown, protects the logic region 114 and exposes the memory region 112 to the first etch process.

In one embodiment, the ME process for patterning the hard mask 771 forms etch residues 724 as shown in FIG. 7c. The etch residues may include silicon nitride. For example, residual nitride materials are disposed on the sacrificial layer 276 and adjacent to the protruding portion of the STI regions. Due to the anisotropic nature of RIE, etch rate at the side walls is much slower, compare to the etch rate at the top and bottom surfaces of the hard mask 771. Etch residues 724 may be generated when the first etch process does not completely remove the hard mask 771, resulting in silicon nitride residues disposed on the side surfaces 780s of the STI regions. In one embodiment, the high step height of the STI regions 780 results in the form of nitride spacers disposed between the recessed surface regions 720r and STI regions. The nitride spacers, for example, include a thickness that is beyond the process margin of the first etch process, thereby generating the etch residues.

The process continues to remove the patterned resist 250. In one embodiment, a second etch process selectively removes the resist layer over the logic region 114. Preferably, the second etch process includes an etch chemistry which is highly selectivity to the resist layer 250. The second etch process, in one embodiment, is a wet etch process employing sulfuric acid/hydrogen peroxide mixture (SPM) to provide the desired etch selectivity. This process removes the resist left after the first etch process without consuming the dielectric layers. For example, the wet etch process may contain the same process steps as that described in FIG. 2d. As such, details for performing the third etch process will not be described. Other etch chemistries or techniques for removing the resist layer are also useful.

Figure 7D:
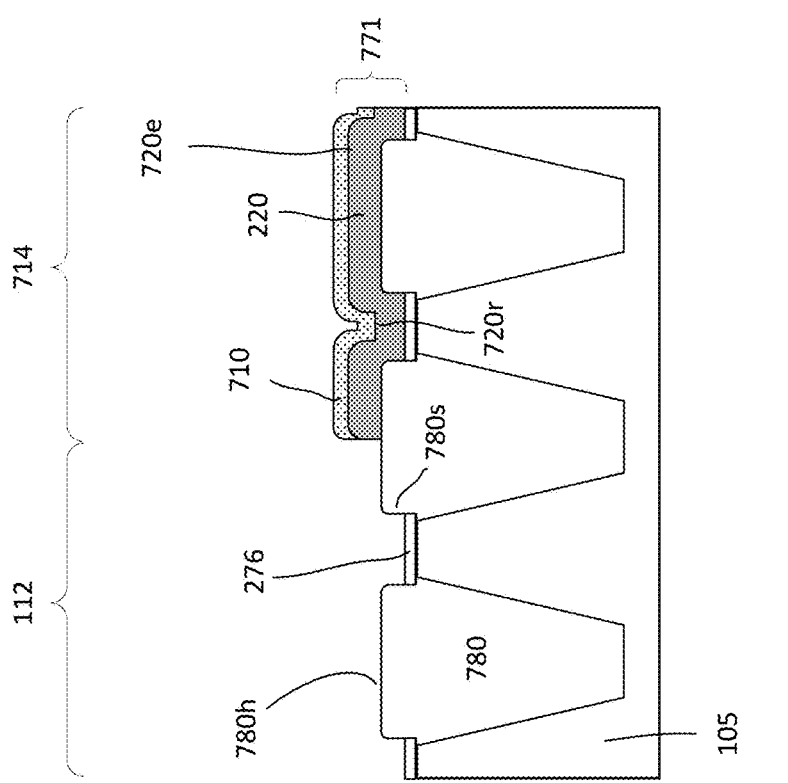

Referring to FIG. 7d, a third etch process is performed. The third etch process, for example, selectively removes residual hard mask material 724 over the memory region 112. The third etch process may be a wet etch process. The wet etch, in one embodiment, includes an etch chemistry which is highly selective to the residual nitride material 724 such that exposed dielectric structures in the memory region 112, including the sacrificial layer 276 and the STI regions 780, are not damaged or recessed. The third etch process may, for example, remove about 100-300 Å of nitride material. The third etch process, in one embodiment, may be performed using phosphoric acid ($H_3PO_4$) to provide the desired etch selectivity. Preferably, the third etch process includes a short etching time to minimize any undesirable impact to the profile of the STI regions, such as a reduction in step height. In an exemplary process, the wet etch employs a heated $H_3PO_4$ chemistry, and is performed at a temperature of about 160° C. for a duration of about 100-300 s. Other suitable process parameters and techniques for selectively removing residual nitride material may also be used. As shown, the patterned hard mask 771 protects the logic region 114 and exposes the memory region 112 to the third etch process.

As described, the patterned hard mask 771 covering the logic region 714 includes a thin silicon oxide layer 710. The thin silicon oxide layer, for example, protects the underlying silicon nitride layer 720 in the logic region from the third etch process, which may include $H_3PO_4$. Table 1 below illustrates experimental data measuring the thickness of various silicon oxide layers after selective nitride etching with $H_3PO_4$. In this experiment, each silicon oxide layer is formed by a different oxidation method on different substrates and the thickness of the silicon oxide layers were measured after the $H_3PO_4$ etch cycle:

| Wafer | Oxidation Method | Thickness of the oxide layers (Å) | |
|---|---|---|---|
| | | After oxidation | After $H_3PO_4$ etching |
| W1 | Ozone Plasma | 37.8 | 25.3 |
| W2 | ISSG | 64.2 | 59.8 |
| W3 | Wet Oxidation (RTO) | 67 | 62.8 |

Although the $H_3PO_4$ etching cycle is designed to remove up to about 500 Å of nitride material, it is observed that a $H_3PO_4$ etching cycle which removes about 100-200 Å of nitride material is generally sufficient to remove any residual nitride material generated in the first etch process described in FIG. 7c. As shown in Table 1, the thin silicon oxide layer formed by all 3 oxidation methods includes a thickness sufficient to prevent an underlying nitride layer from being consumed during the third etch process under the condition that the $H_3PO_4$ etching cycle is performed to remove an amount of nitride material that is equal to or less than 500 Å.

The process may continue to process the device regions in sequence as described in FIG. 1d. For example, the remaining patterned hard mask 771 protects the logic region from oxidation and thermal budget while the memory region 112 is processed to form memory components or devices, including memory gate. The logic region 114 may be processed after processing the memory region 112. Additional processes may be performed to complete the device.

Figure 8A:
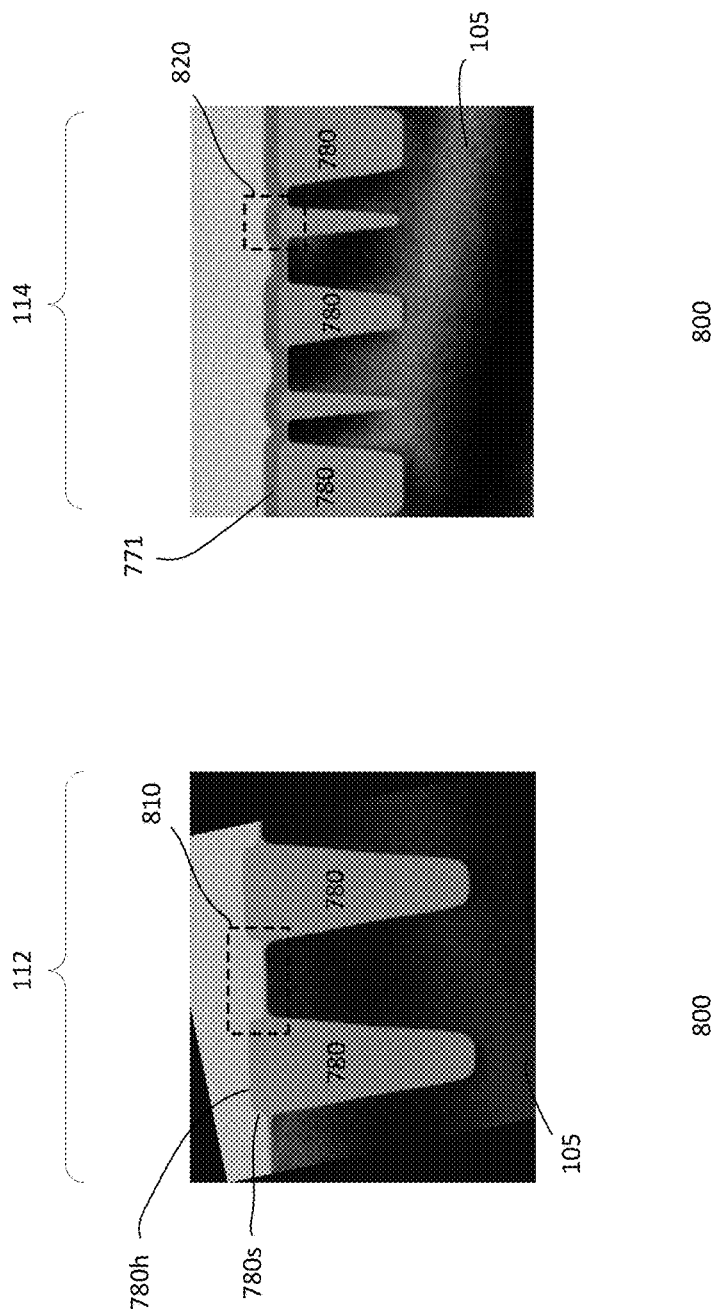
FIGS. 8a-8b show TEM images of another embodiment of a portion of a device in the present disclosure.
Figure 8B:
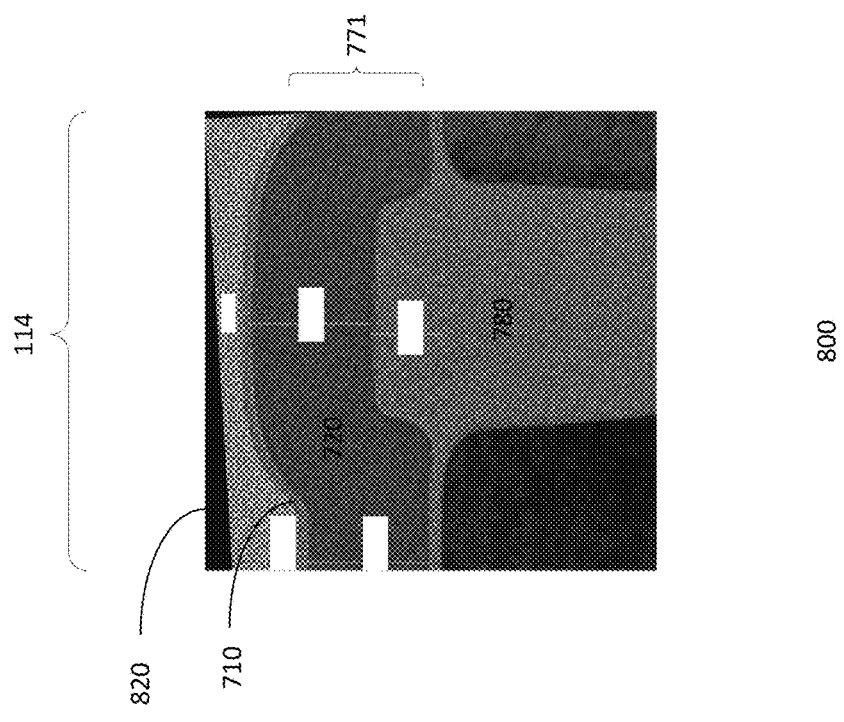
Figure 8B:
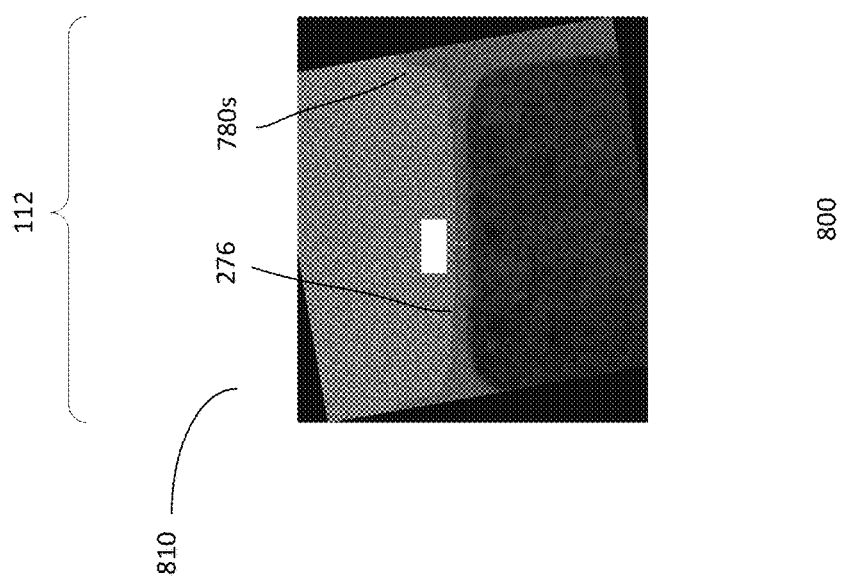

FIGS. 8a-8b show transmission electron microscope (TEM) images of a device 800. In one embodiment, the device includes a memory region 112 and a non-memory region, such as a logic region 114. The device is, for example, an IC. Other types of devices may also be useful. The device 800 is similar or the same as that formed by the process described in FIGS. 7a-7d. In the interest of brevity, common elements and features having the same reference numerals may not be described or described in detail.

Referring to FIG. 8a, a partially processed substrate 105 is provided. The substrate, for example, includes various device regions 112 and 114 and isolation regions 780. The partially processed substrate may be at the same stage as that described FIG. 7d. In accordance with an embodiment of the present disclosure, the hard mask 771 is patterned to selectively expose the memory region 112. As for the logic region 114, it is covered by the patterned hard mask 771. The hard mask, as shown, conformally lines the protruding portions of the STI regions 780 and the sacrificial layer 276 and includes a non-planar surface topography.

In one embodiment, the profile of the STI regions create a high step height topography, with the top surface of the sacrificial layer 276 forming recessed regions between the elevated top surface 780h of the STI regions. For example, the STI regions 780 include protruding portions having side surfaces 780s exposed above the sacrificial layer 276.

Referring to FIG. 8b, magnified views 810 and 820 of portions of the memory region 112 and logic region 114 are provided. As described in FIGS. 7b-7c, a first etch process is employed to pattern the hard mask 771 and a third etch process is employed to remove any residual hard mask materials 724 generated from the first etch process. The thin silicon oxide layer 710 over the nitride layer 720 in the logic region 114 is shown to be sufficient to protect the underlying nitride layer from being consumed during the third etch process after $H_3PO_4$ residue nitride removal. The sacrificial layer 276, for example, serves as an etch stop layer. As shown, the etch processes, in combination, completely removes the hard mask 771 while minimizing consumption of the underlying sacrificial layer 276 and the step height of the STI regions 780. This advantageously results in eliminating any residual hard mask materials on the recessed regions and maintaining the profile of the STI regions. For example, the sacrificial layer 276 and the side surfaces 780s of the STI regions exposed above the sacrificial layer 276 are devoid of residual nitride materials. Furthermore, the patterned hard mask 771 in accordance with the embodiment described in FIG. 7d protects the logic region 114 from the third etch process used to remove any residual hard mask materials 724.

The embodiments described herein result in advantages. For example, the presently disclosed hard mask removal techniques include high etch selectivity which reliably and completely removes various hard mask materials. This advantageously eliminates any hard mask residual concerns which affect the reliability of the device. In addition, the techniques as described minimize or avoid consumption of materials of the underlying layer(s) during removal of the hard mask, thereby maintaining the integrity of these underlying layer(s). Further, as an example, the techniques as described are used for removal of hard mask layer having a non-planar surface topography due to the underlying STI regions with protruded portions. It is understood that the various techniques as described are applicable to effectively remove hard mask layer having non-planar surface topography due to any underlying layer(s) with non-planar top surface. In some instances, the techniques as described may also be used to effectively remove hard mask layer with planar surface.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a substrate prepared with isolation regions, the substrate having a non-planar substrate surface topology created by the isolation regions, wherein the substrate comprises at least first and second regions, the first region comprises a memory region and the second region comprises a logic region;
forming a hard mask layer covering the substrate and the isolation regions with a non-planar surface topology, wherein the hard mask layer comprises a pad layer and a first hard mask layer on the pad layer, the hard mask layer includes a non-planar hard mask surface topology which tracks the underlying non-planar substrate surface topology; and
selectively removing a select portion of the hard mask layer over a select region, which is one of the first and second regions, while leaving a non-select portion of the hard mask layer over a non-select region, which is other of the first and second regions, for processing of the select region of the substrate.

2. The method of claim 1 wherein the select region is the memory region and the non-select region is the logic region.

3. The method of claim 1 wherein the isolation regions comprise top portions which protrude over a top surface of the substrate, creating elevated portions with a step height over the top surface of the substrate and recessed regions between the elevated portions of the isolation regions to create the non-planar substrate surface topology.

4. The method of claim 3 wherein forming the hard mask layer comprises forming a first dielectric layer over the substrate and the isolation regions and forming a second dielectric layer on the first dielectric layer.

5. The method of claim 4 wherein:
the pad layer comprises a pad oxide;
the first dielectric layer comprises silicon nitride; and
the second dielectric layer comprises silicon oxide.

6. The method of claim 1, wherein selectively removing the select portion of the hard mask layer comprises:
forming a resist layer over the hard mask layer;
patterning the resist layer to form openings to expose the select portion of the hard mask layer over the select region while the patterned resist layer protects the non-select portion of the hard mask layer over the non-select region; and
selectively removing the select portion of the hard mask layer exposed by the patterned resist layer.

7. The method of claim 6 comprising:
performing a first wet etch process to remove exposed portion of the second dielectric layer of the hard mask layer over the select region, wherein the first wet etch process includes an etch chemistry which is highly selective to the second dielectric layer;
performing a second wet etch process to remove the patterned resist layer; and
performing a third wet etch process to remove exposed portion of the first dielectric layer over the select region, wherein the third wet etch process includes an etch chemistry which is highly selective to the first dielectric layer such that the underlying isolation regions are not damaged by the third wet etch process.

8. The method of claim 7 wherein:
the first wet etch process is performed using diluted hydrofluoric acid;
the second wet etch process is performed using a sulfuric acid/hydrogen peroxide mixture; and
the third wet etch process is performed using phosphoric acid.

9. The method of claim 6 comprising:
performing a first anisotropic etch process to remove exposed portion of the first and second dielectric layers of the hard mask layer over the select region; and
performing a second wet etch process to remove the patterned resist layer.

10. The method of claim 9 wherein the first anisotropic etch comprises
a first sub-etch using a first etch chemistry to remove the second dielectric layer; and
a second sub-etch using a second etch chemistry to remove the first dielectric layer.

11. The method of claim 10 wherein:
the second sub-etch leaves residues of the first dielectric layer on exposed sidewalls of the isolation region; and
further performing a third etch after the second wet etch to remove the residues of the first dielectric layer.

12. A method of forming a device comprising:
providing a substrate prepared with isolation regions having a non-planar surface topology, wherein the substrate comprises at least first and second regions, the first region comprises a memory region and the second region comprises a logic region;
forming a hard mask layer covering the substrate and the isolation regions with non-planar surface topology, wherein forming the hard mask layer comprises forming a first dielectric layer over the substrate and the isolation regions and processing the first dielectric layer to form a sufficiently thin second dielectric layer in a top portion of the first dielectric layer; and
selectively removing a select portion of the hard mask layer over a select region, which is one of the first and second regions, while leaving an unselect portion of the hard mask layer over a non-select region, which is other of the first and second regions, for processing of the select region of the substrate.

13. The method of claim 12 wherein the first dielectric layer comprises silicon nitride and the second dielectric layer which is formed as part of the top portion of the first dielectric layer comprises silicon oxide.

14. The method of claim 13 wherein processing the first dielectric layer to form the sufficiently thin second dielectric layer comprises:
performing a plasma surface treatment on the top portion of the first dielectric layer;
performing a wet oxidation process on the top portion of the first dielectric layer; or
performing a wet rapid thermal oxidation process on the top portion of the first dielectric layer.

15. The method of claim 14 comprising:
forming a resist layer over the hard mask layer; and
patterning the resist layer to form openings to expose portion of the hard mask layer over the select region while the patterned resist layer protects portion of the hard mask layer over the non-select region.

16. The method of claim 15 comprising:
performing a first etch process to remove exposed portion of the hard mask layer over the select region, wherein the first etch process includes an etch chemistry which is highly selective to the hard mask layer;
performing a second etch process to remove the patterned resist layer; and performing a third etch process to remove residual hard mask material over the select region.

17. The method of claim 16 wherein:
the first etch process comprises an anisotropic dry etch;
the second etch process is performed using a wet etch process; and
the third etch process is performed using phosphoric acid.

18. A method of forming a device comprising:
providing a substrate having a non-planar substrate topology created by isolation regions;
forming a hard mask layer on the substrate with the non-planar substrate topology, the hard mask layer conformally covers the substrate and includes a non-planar hard mask surface topology which tracks the underlying non-planar substrate topology; and
selectively removing a select portion of the hard mask layer over a select region, which is one of the first and second regions, while leaving an unselect portion of the hard mask layer over a non-select region, which is other of the first and second regions, for processing of the select region of the substrate.

19. The method of claim 18 wherein the hard mask layer comprises a pad layer on the substrate and a first hard mask layer on the pad layer.

20. The method of claim 19 comprises forming a second hard mask layer on the first hard mask layer.

21. The method of claim 20 wherein:
the pad layer comprises a pad oxide;
the first hard mask layer comprises silicon nitride; and
the second hard mask layer comprises silicon oxide.

22. The method of claim 20 wherein forming the second hard mask layer comprises:
performing a plasma surface treatment on the top portion of the first hard mask layer;
performing a wet oxidation process on the top portion of the first hard mask layer; or
performing a wet rapid thermal oxidation process on the top portion of the first hard mask layer.

23. The method of claim 20 comprising:
performing a first wet etch process to remove select portion of the second hard mask layer of the hard mask layer over the select region, wherein the first wet etch process includes an etch chemistry which is highly selective to the second hard mask layer;
performing a second wet etch process to remove a patterned resist layer for removing the select portion of the hard mask layer; and
performing a third wet etch process to remove select portion of the first hard mask layer over the select region, wherein the third wet etch process includes an etch chemistry which is highly selective to the first hard mask layer such that the underlying isolation regions are not damaged by the third wet etch process.

24. The method of claim 20 comprising:
performing a first anisotropic etch process to remove select portion of the first and second hark mask layers of the hard mask layer over the select region; and
performing a second wet etch process to remove a patterned resist layer for removing the select portion of the hard mask layer.

25. The method of claim 24 wherein the first anisotropic etch process comprises:
a first sub-etch using a first etch chemistry to remove the second hard mask layer; and
a second sub-etch using a second etch chemistry to remove the first hard mask layer.

* * * * *